(12) United States Patent
Nguyen et al.

(10) Patent No.: US 7,544,073 B2
(45) Date of Patent: Jun. 9, 2009

(54) UNIVERSAL SERIAL BUS (USB) FLASH DRIVE WITH SWIVEL CAP FUNCTIONALITIES WITH TWO LOCKING POSITIONS

(75) Inventors: David Nguyen, San Jose, CA (US); Jim Chin-Nan Ni, San Jose, CA (US); Charles Chung Lee, Cupertino, CA (US); Abraham Chih-Kang Ma, Fremont, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 67 days.

(21) Appl. No.: 11/927,484

(22) Filed: Oct. 29, 2007

(65) Prior Publication Data

US 2008/0278902 A1 Nov. 13, 2008

Related U.S. Application Data

(63) Continuation-in-part of application No. 10/991,313, filed on Nov. 16, 2004, now Pat. No. 7,296,345, and a continuation-in-part of application No. 11/309,847, filed on Oct. 12, 2006, and a continuation-in-part of application No. 11/466,759, filed on Aug. 23, 2006, which is a continuation-in-part of application No. 10/789,333, filed on Feb. 26, 2004, now Pat. No. 7,318,117.

(51) Int. Cl.
*H01R 13/44* (2006.01)

(52) U.S. Cl. ..................................................... 439/135
(58) Field of Classification Search ................. 439/610, 439/140, 134–137, 518, 638, 133, 680, 131, 439/304, 148, 353, 357, 76.1, 141, 350, 352, 439/367
See application file for complete search history.

(56) References Cited

U.S. PATENT DOCUMENTS

| 6,999,322 | B1 * | 2/2006 | Lin ............................ 361/752 |
| 7,241,153 | B2 * | 7/2007 | He et al. ..................... 439/148 |
| 7,275,941 | B1 * | 10/2007 | Bushby ...................... 439/133 |
| 7,407,393 | B2 | 8/2008 | Ni et al. |
| 7,420,803 | B2 | 9/2008 | Hsueh et al. |

* cited by examiner

*Primary Examiner*—Edwin A. Leon
(74) *Attorney, Agent, or Firm*—Maryam Imam

(57) ABSTRACT

A Universal Serial Bus (USB) flash drive includes a slim USB device having an end used to couple the USB flash drive to a host and an opposite end, and a swivel "strap shaped" metal cap having a circle cut out disposed on both cap legs. The snap coupling circle attachment allows the swivel cap to rotate substantially into a first and a second locking position and to rotate substantially 360 degrees about the z-axis of the USB device. The metal cap is generally in a locked position when the snap slot is aligned atop the snap lock tabs such that the protrusion snap ring is descended downward until the positioned flush against the snap lock groove. When unlocked the protrusion snap ring is raised up and rested upon the two snap lock tabs.

13 Claims, 21 Drawing Sheets

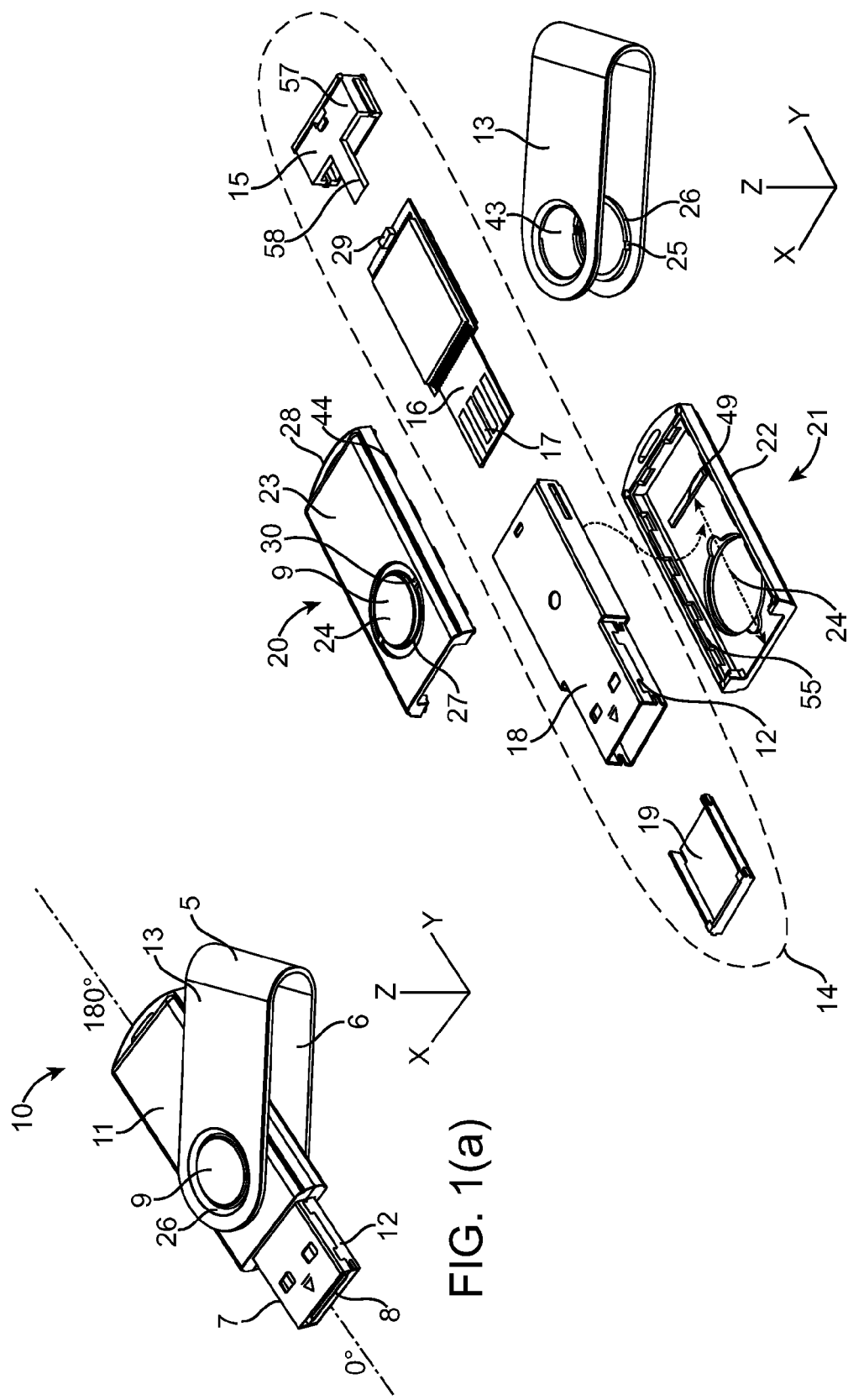

LOCKED
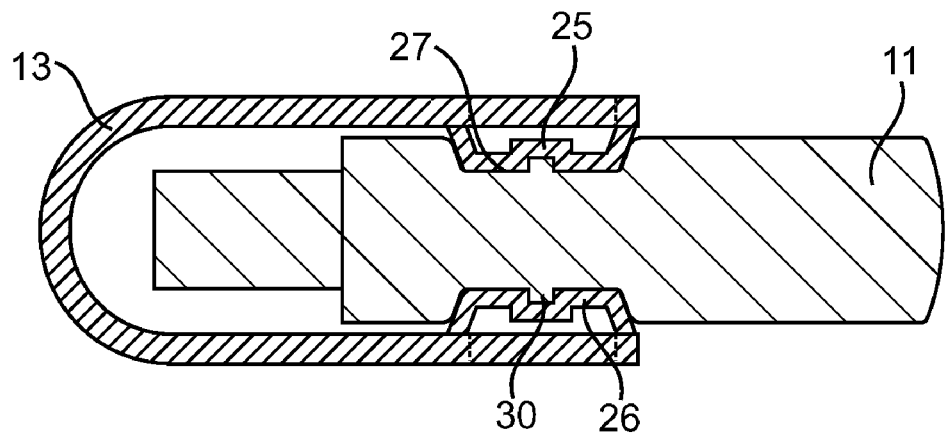
UNLOCKED
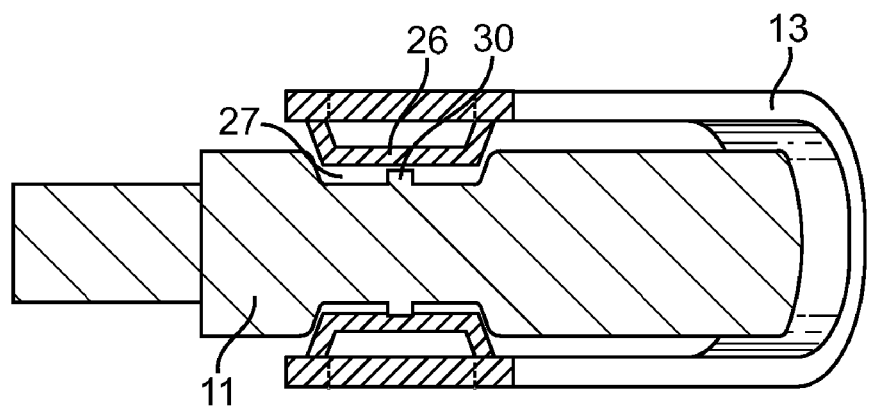
FIG. 1(c)

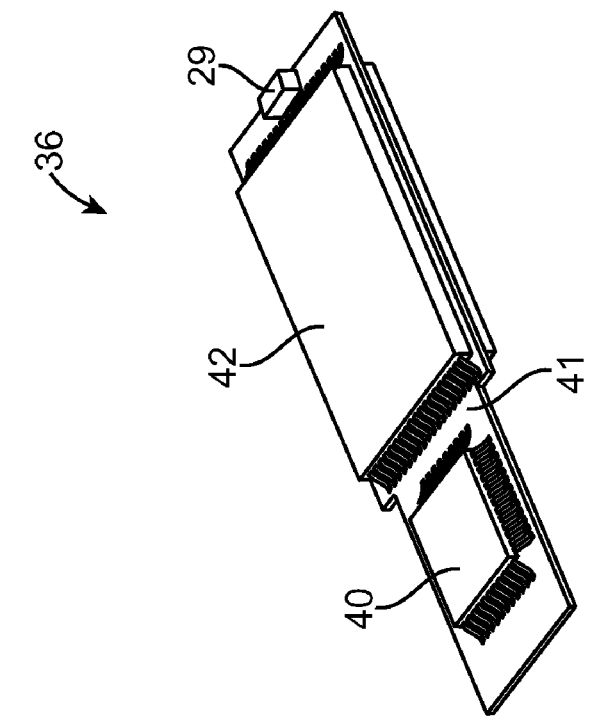
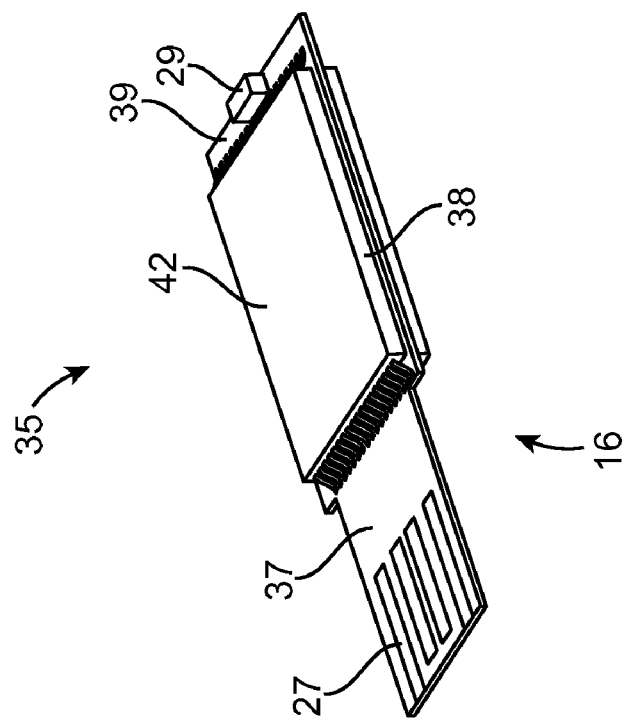
FIG. 2

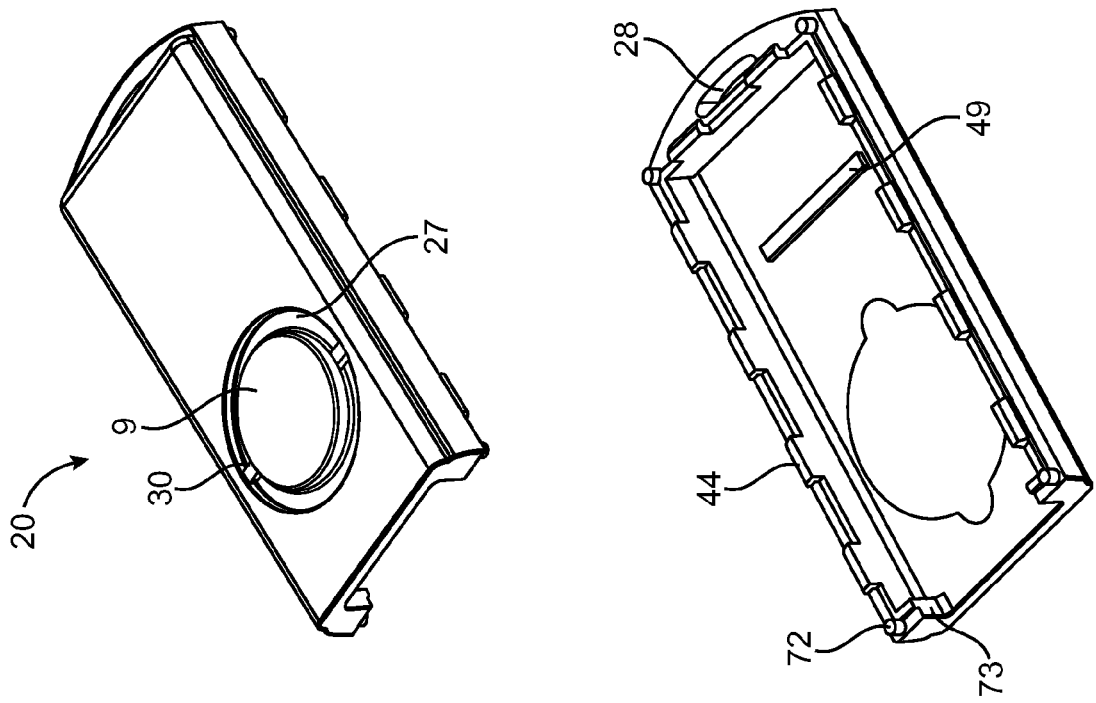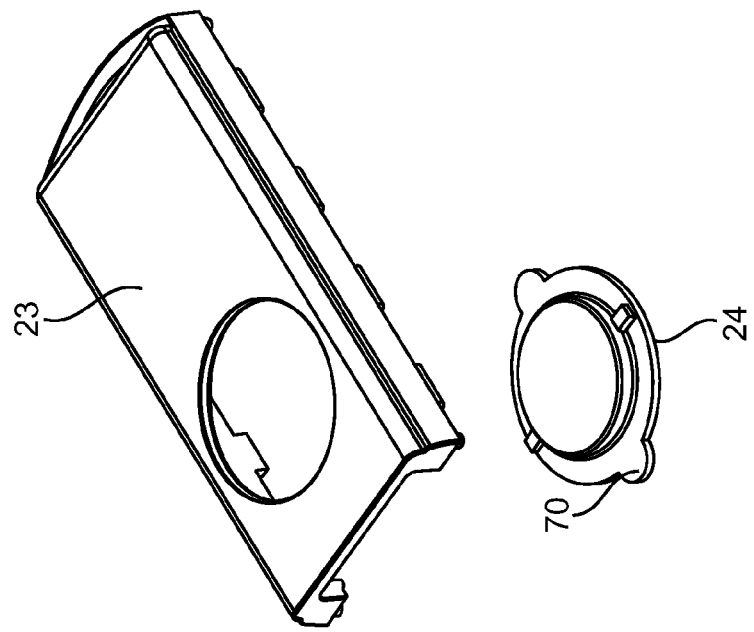
FIG. 6

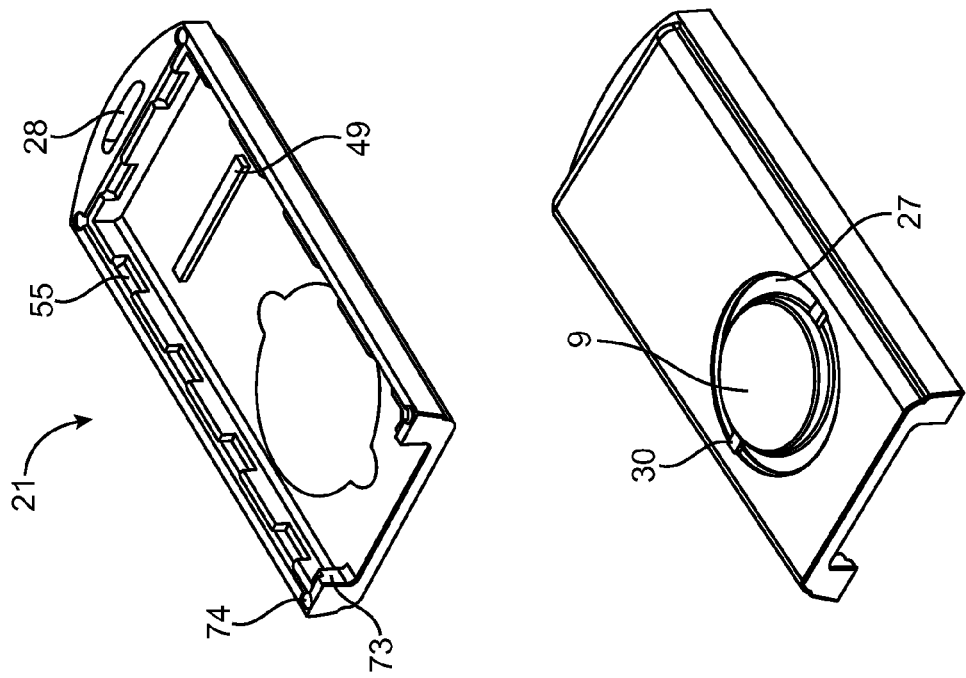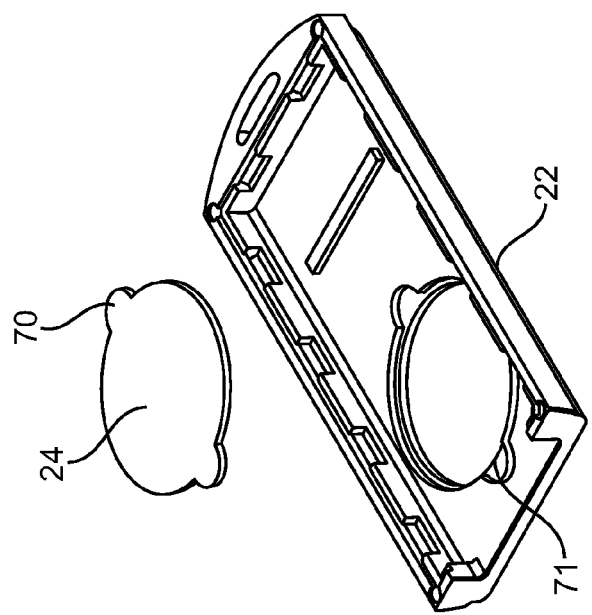
FIG. 7

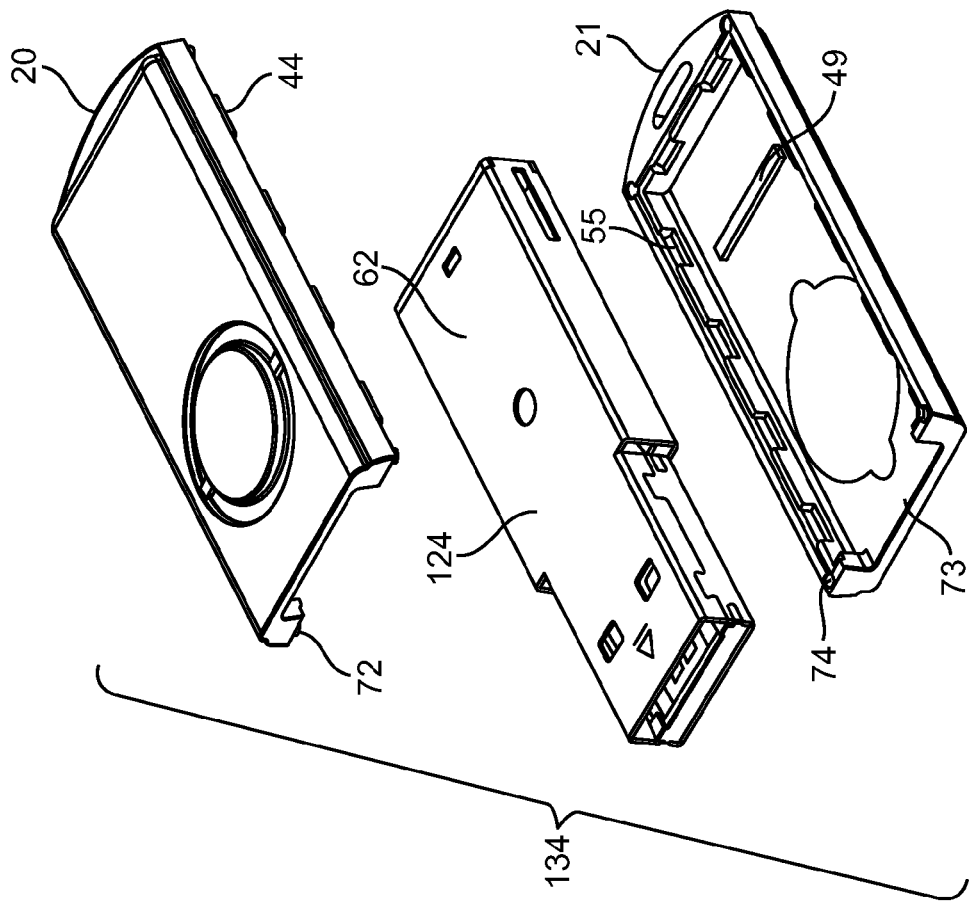
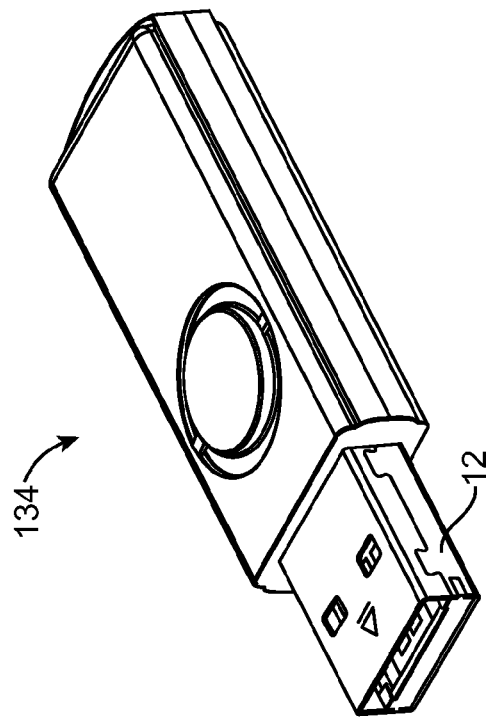
FIG. 10

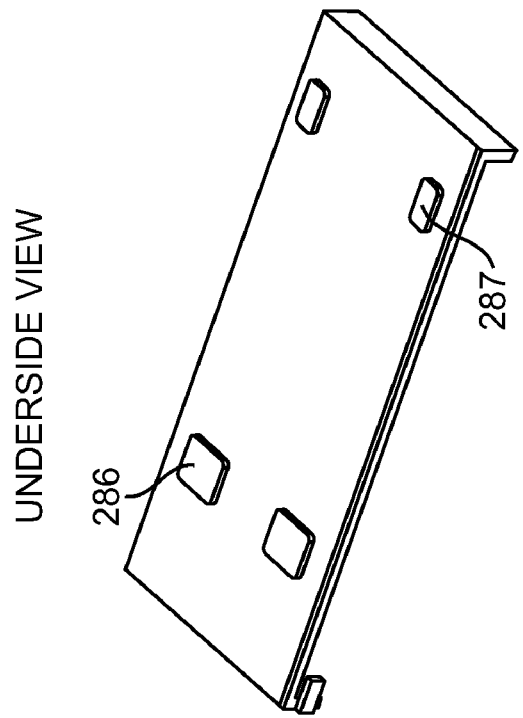
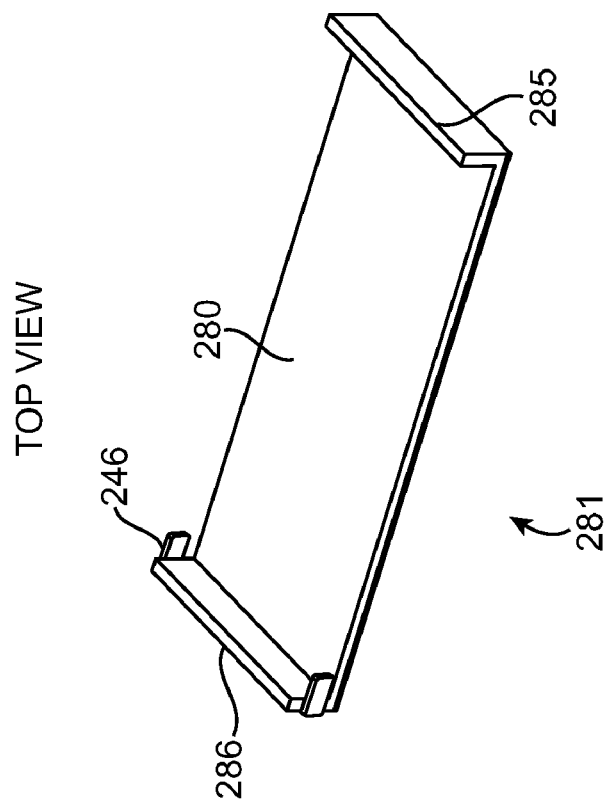
FIG. 15

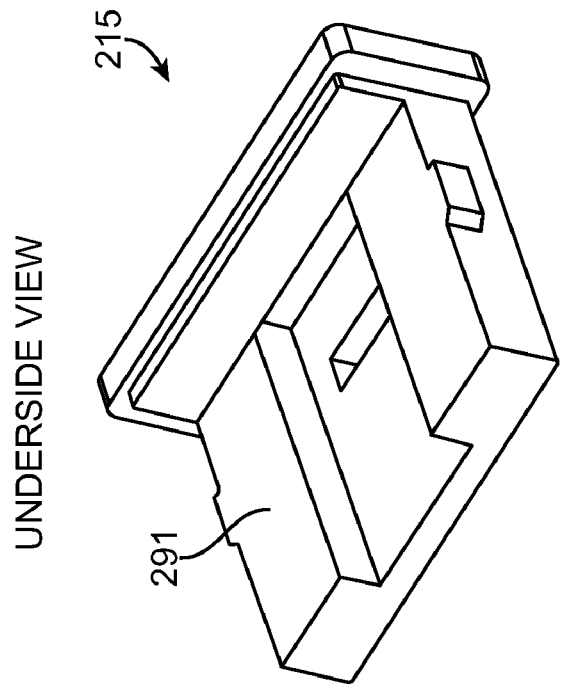
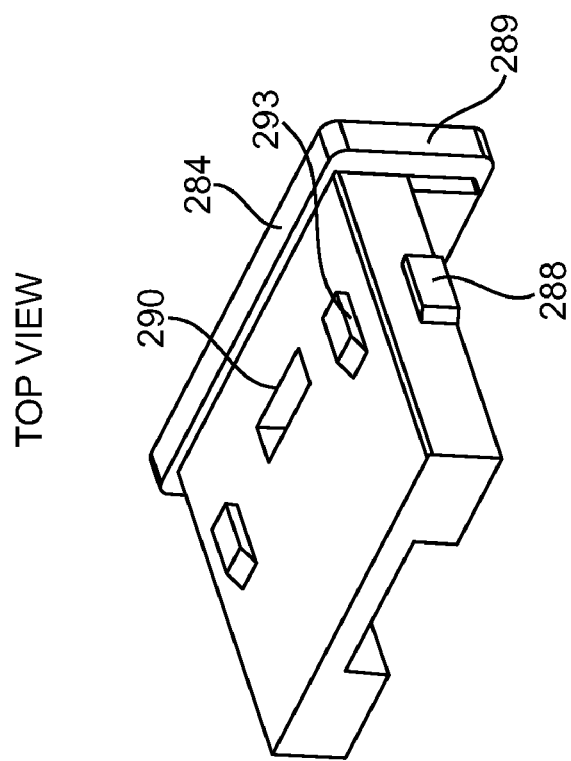
FIG. 16

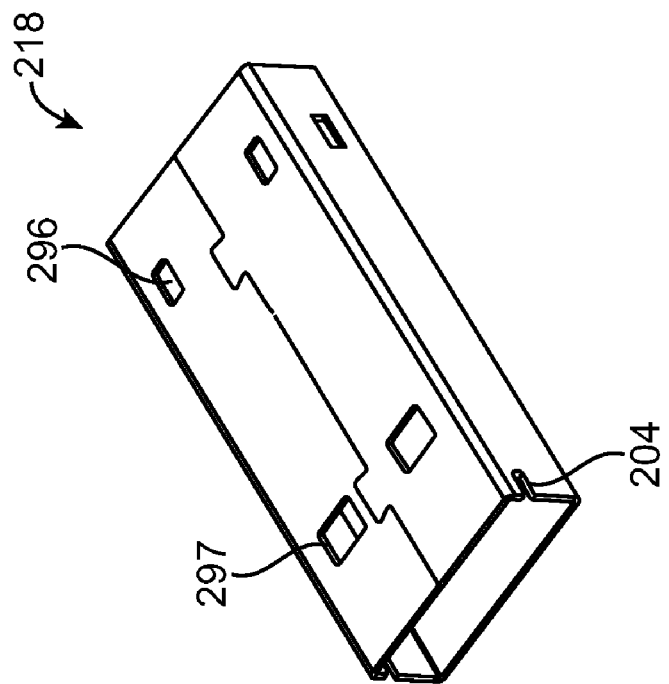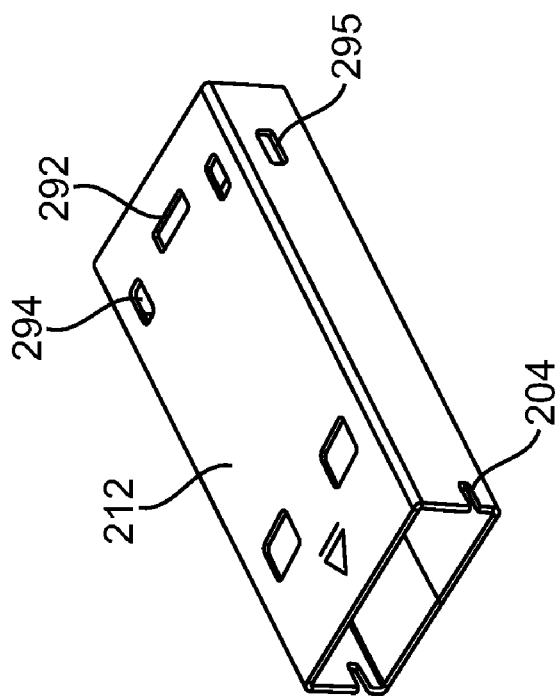
FIG. 17

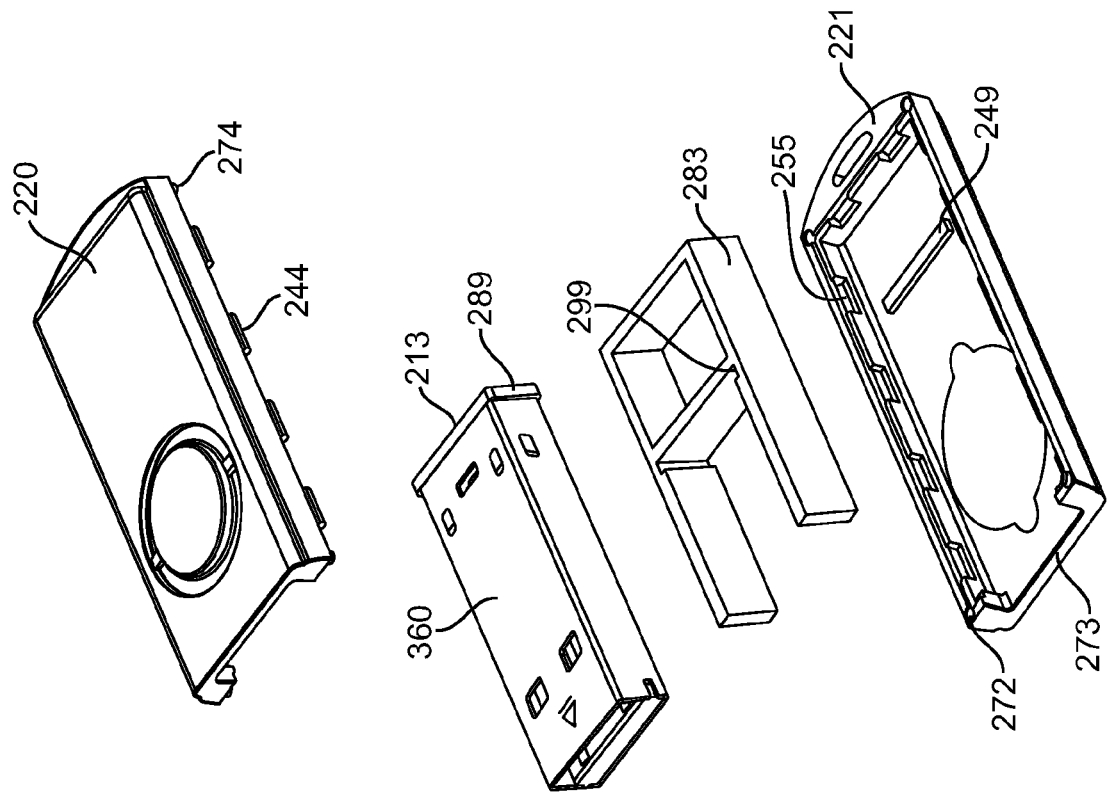
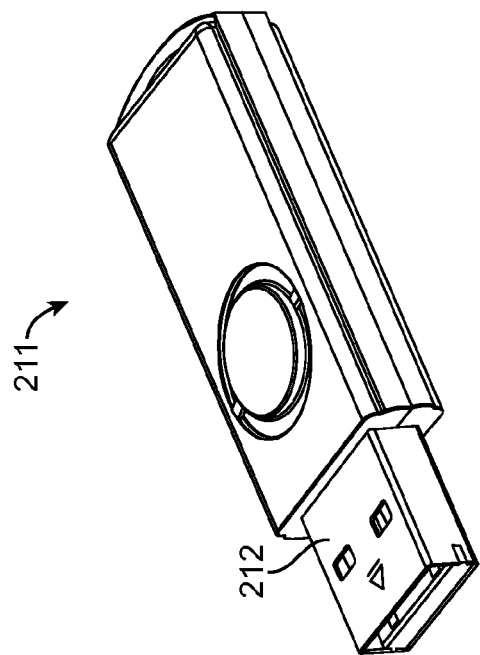
FIG. 20

UNIVERSAL SERIAL BUS (USB) FLASH DRIVE WITH SWIVEL CAP FUNCTIONALITIES WITH TWO LOCKING POSITIONS

CROSS REFERENCE TO RELATED APPLICATIONS

This application is a continuation-in-part (CIP) of co-pending U.S. Patent application for "A Method for Manufacturing a Memory Device", U.S. application Ser. No. 10/991,313, filed Nov. 16, 2004. This application is also a continuation in part of U.S. Patent application for "USB Device with Integrated USB Plug with USB Substrate Supporter Inside", U.S. application Ser. No. 11/309,847, filed Oct. 12, 2006. This application is also a continuation in part of U.S. Patent application for "Flash Memory Controller for Electronic Data Flash Card", U.S. application Ser. No. 11/466,759, filed on Aug. 23, 2006, which is a CIP of "System and Method for Controlling Flash Memory", U.S. application Ser. No. 10/789,333, filed on Feb. 26, 2004.

BACKGROUND OF THE INVENTION

1. Field of the Invention

The present invention relates generally to the field of universal serial bus (USB) flash drives (or devices) and particularly to USB flash drives having an attached and locking swivel cap to protect the otherwise exposed USB head.

2. Description of the Prior Art

As computers have gained enormous popularity in recent decades, so has the need for better and more efficient ways of storing memory. Notable among memory devices are the portable ones that may be carried around by the user to access computers at different locations. This is particularly common in the case of personal computers (PC) where the need often arises to transfer data from one PC to another. Examples of portable memory devices include nonvolatile memory devices such as a universal serial bus (USB) flash drive that is removably connectable to a computer.

USB flash drives are available in various shapes and forms. The USB flash drive needs a USB plug connector to be coupled to a USB port of a host device such as a PC. The USB flash drive generally has a metal casing and a cover which is screwed in or otherwise attached to the casing. To access the USB plug connector, the user needs to open the metal cover and place it in the back on the casing after finishing the work with the USB flash drive. There is therefore the possibility of losing or misplacing the cover because it is completely detached when removed from the USB plug connector. Furthermore, a detachable cover creates the possibility of leaving the USB plug connector uncovered, thereby adversely affecting the security of the connector.

The need therefore arises for a USB flash drive having a USB device that is secure and that uses a cap that is unlikely to be detached therefrom.

SUMMARY OF THE INVENTION

Briefly, an embodiment of the present invention includes a slim USB device having an end used to couple the USB flash drive to a host, an opposite end, and a swivel "strap shaped" metal cap having a circle cut out disposed on both cap legs. The snap coupling circle attachment allows the swivel cap to rotate substantially into a first and a second locking position and to rotate substantially 360 degrees about the z-axis of the USB device. The metal cap is generally in a locked position when the snap slot is aligned atop the snap lock tab such that the protrusion snap ring is positioned flush against the snap lock groove. The metal cap is generally in an unlocked position when the snap slot is not aligned atop the snap lock tabs. When unlocked the protrusion snap ring is raised up and rested upon the two snap lock tabs. The swivel cap locking and unlocking mechanism requires the protrusion snap ring to raise up and out of the snap lock groove to rest on the snap lock tabs when unlocked, and descend downward until the protrusion snap ring is pressed flush with the snap lock groove, and the lock tab is secured inside snap slot, when locked.

The foregoing and other objects, features and advantages of the present invention will be apparent from the following detailed description of the preferred embodiments which make reference to several figures of the drawing.

IN THE DRAWINGS

FIG. 1(a) shows a universal serial bus (USB) flash drive 10 to include USB metal plug 12, USB device 11, snap coupling circle attachment 9, and a swivel "strap-shaped" metal cap 13, in accordance with an embodiment of the present invention.

FIG. 1(b) shows a view of the disassembled parts of USB flash drive 10. USB flash drive 10 is shown to be comprised of USB device 11 and metal cap 13.

FIG. 1(c) shows a cross section view of USB flash drive 10.

FIG. 2 shows the top and bottom side of the PCBA 16.

FIG. 6 shows a top angular perspective of both the top and bottom of upper molding 20.

FIG. 7 shows a top angular perspective of both the top and bottom of lower molding 21.

Figure 9:
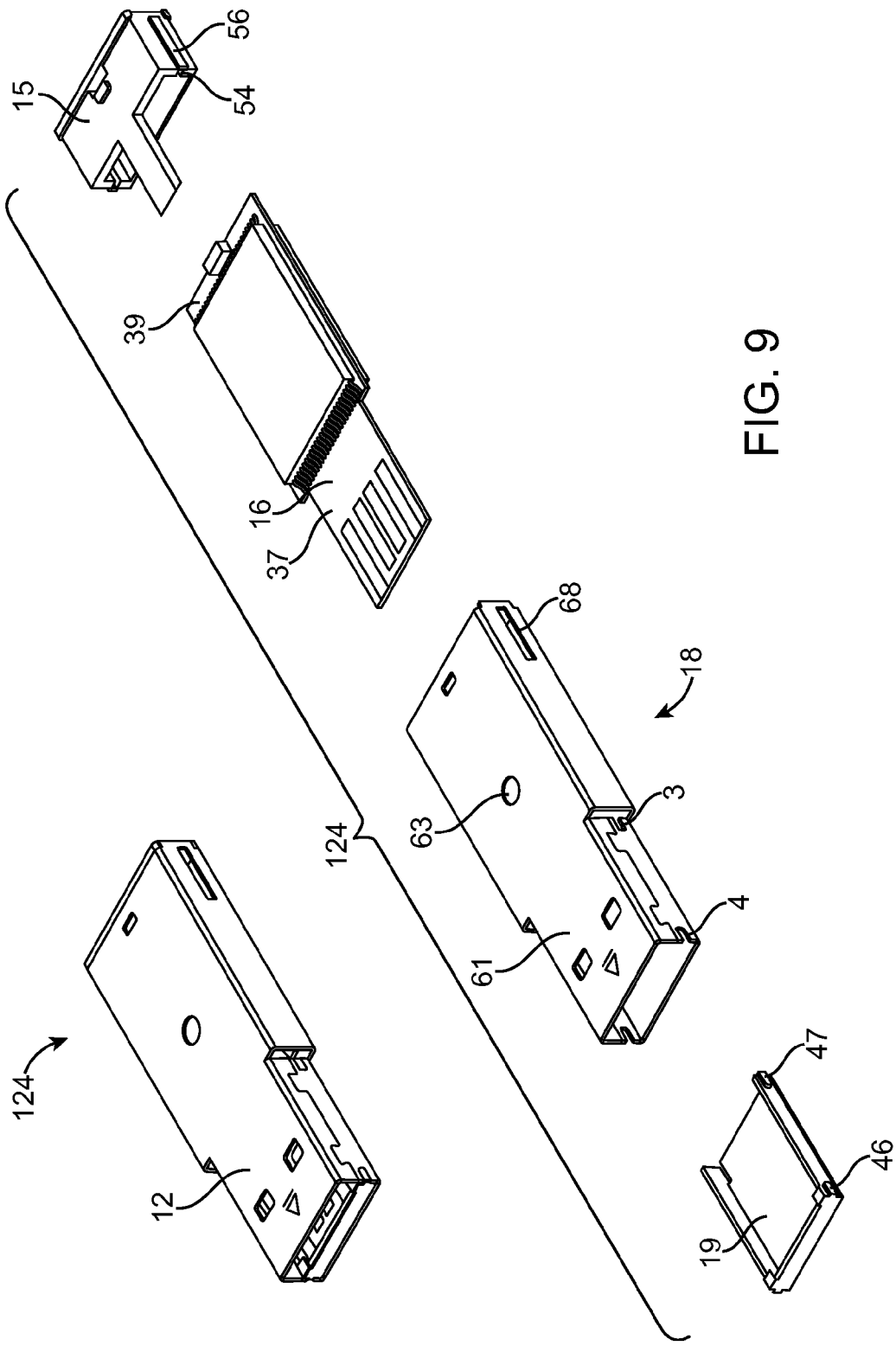

FIG. 9 shows a step used to manufacture the USB flash drive 10, in accordance with a method of the present invention. In. FIG. 9, at step 115, the PCB support 19 is positioned into the metal case 18 by pressing the PCB support 19 into the metal case 18 until the PCB tab 47 of the PCB support 19 snap into the metal case back slot 3 of the metal case 18 and the PCB tab 46 of the PCB support 19 snap into the metal case front slot 4 of the PCB support 16.

FIG. 10 shows a step used to manufacture the USB flash drive 10, in accordance with a method of the present invention. In FIG. 10 at step 125, the metal case and end cap sub-assembly 124 is placed into lower molding 21.

Figure 11:
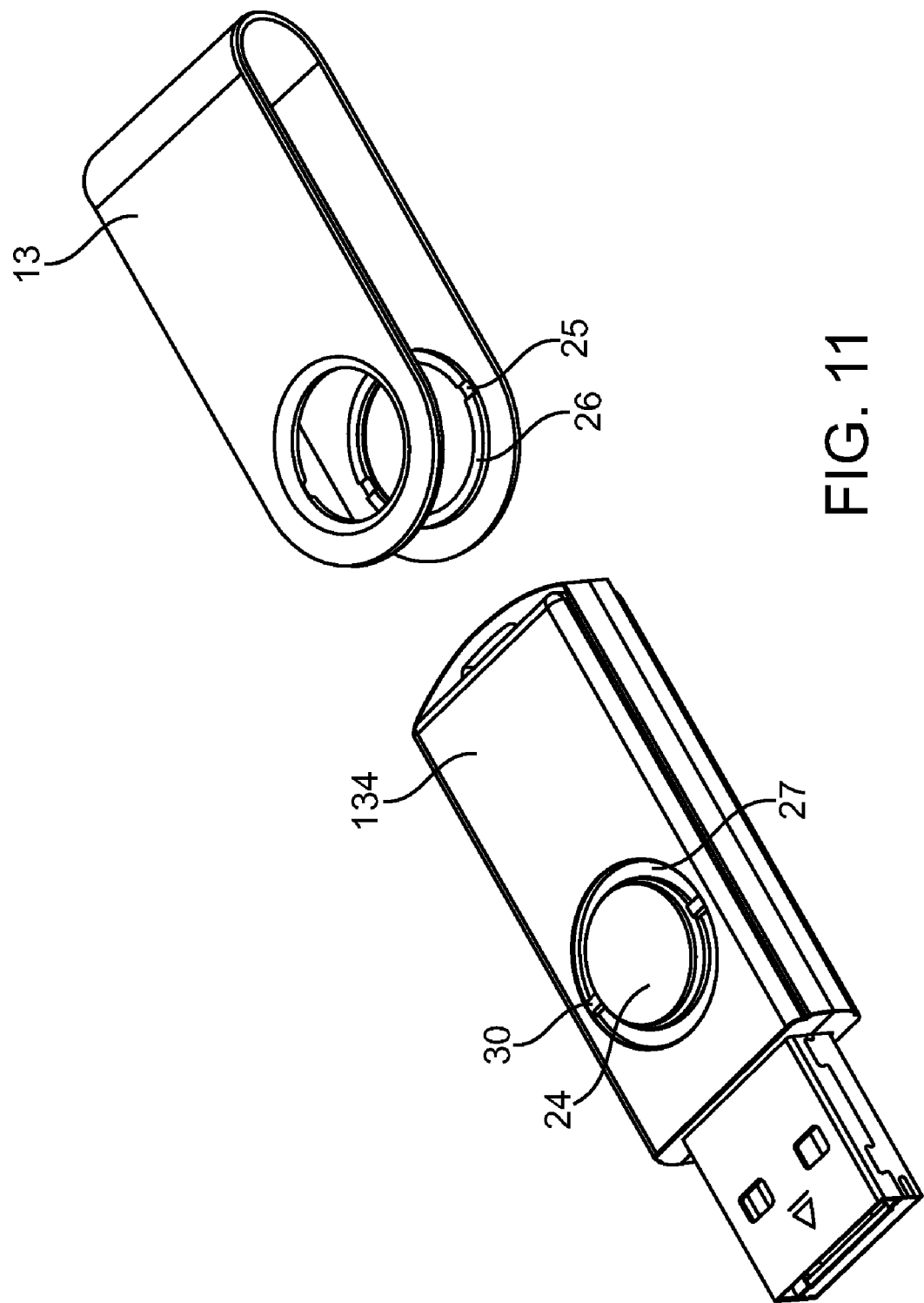

FIG. 11 shows a step used to manufacture the USB flash drive 10, in accordance with a method of the present invention. In FIG. 11 at step 140, metal cap 13 is attached to USB device 11 sub-assembly 134.

Figure 12:
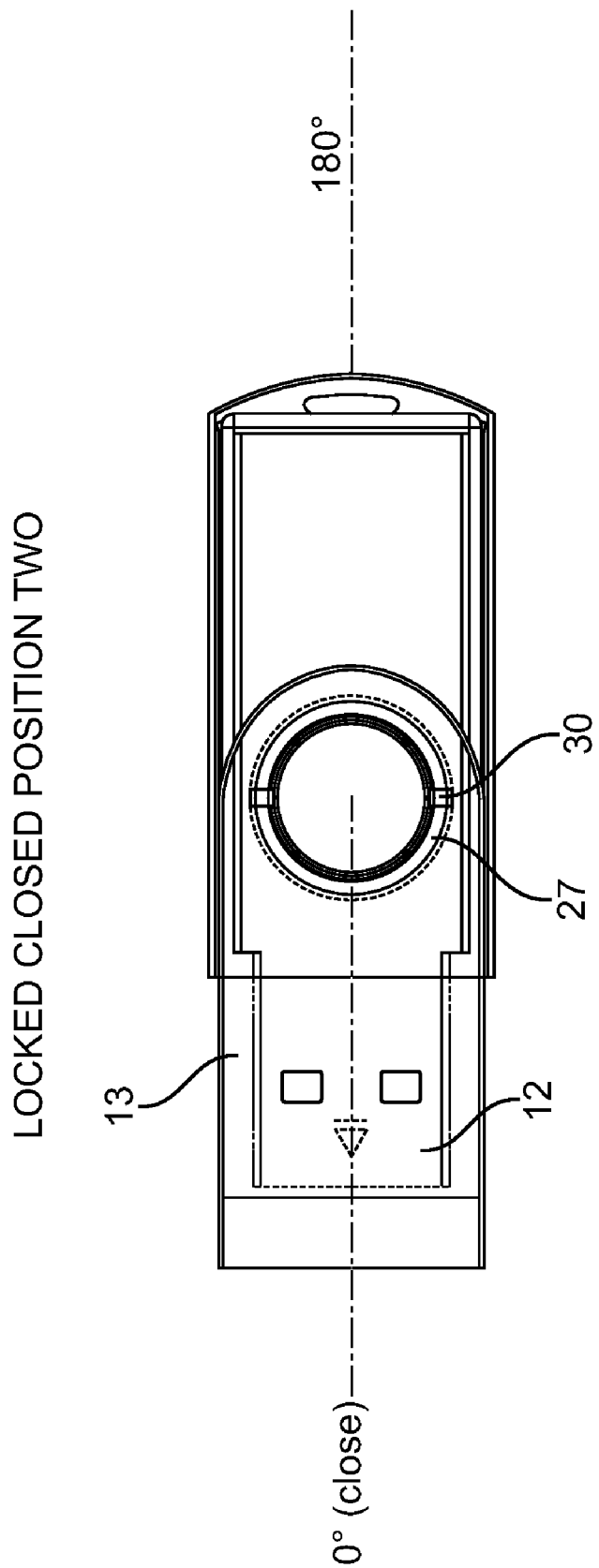

FIG. 12 shows a top view of USB flash drive 10 with metal cap 13 in locked closed position two.

Figure 13:
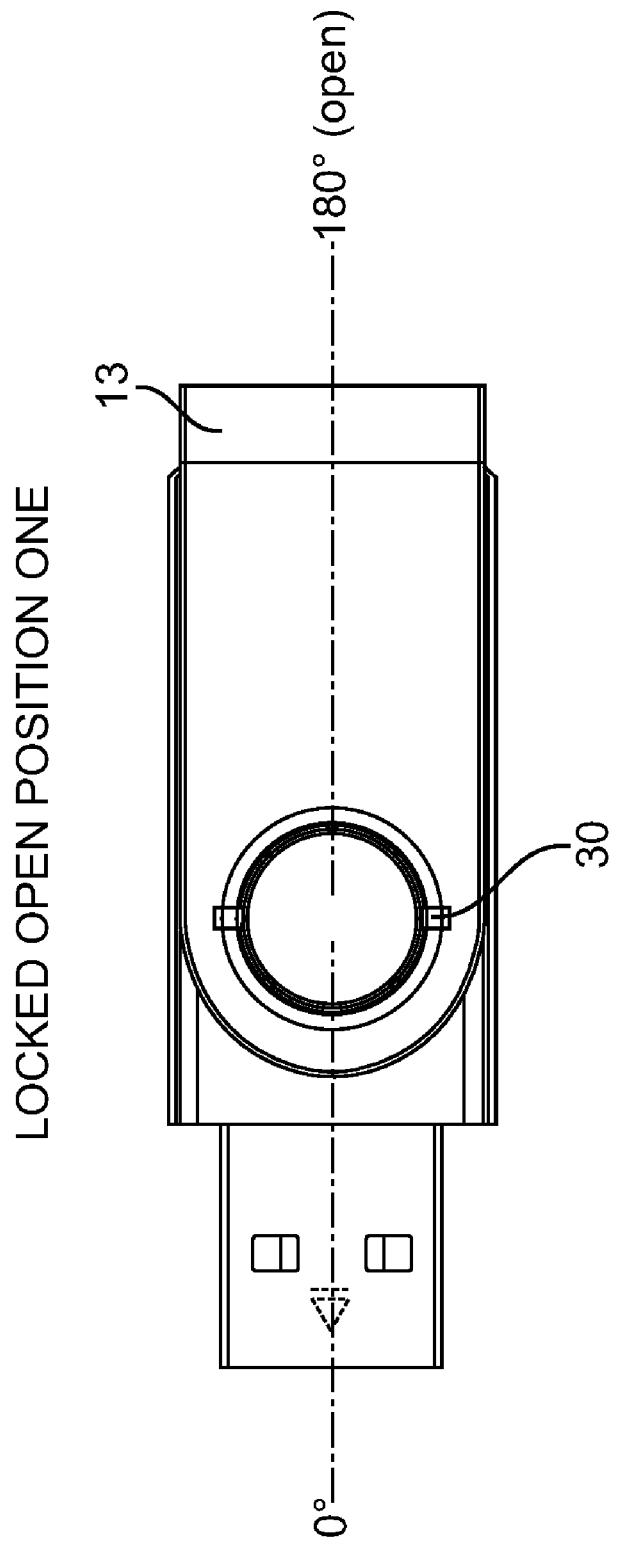

FIG. 13 shows a top view of USB flash drive 10 with metal cap 13 in locked open position one.

FIG. 14(a) shows parts of a USB flash drive 1, in accordance with another embodiment of the present invention.

FIG. 14(b) shows a view of the disassembled parts of USB flash drive 1.

FIG. 15 shows the top and underside views of COB support 281.

FIG. 16 shows the top and underside views of end cap 215.

FIG. 17 shows the top and underside views of metal case 218.

Figure 18:
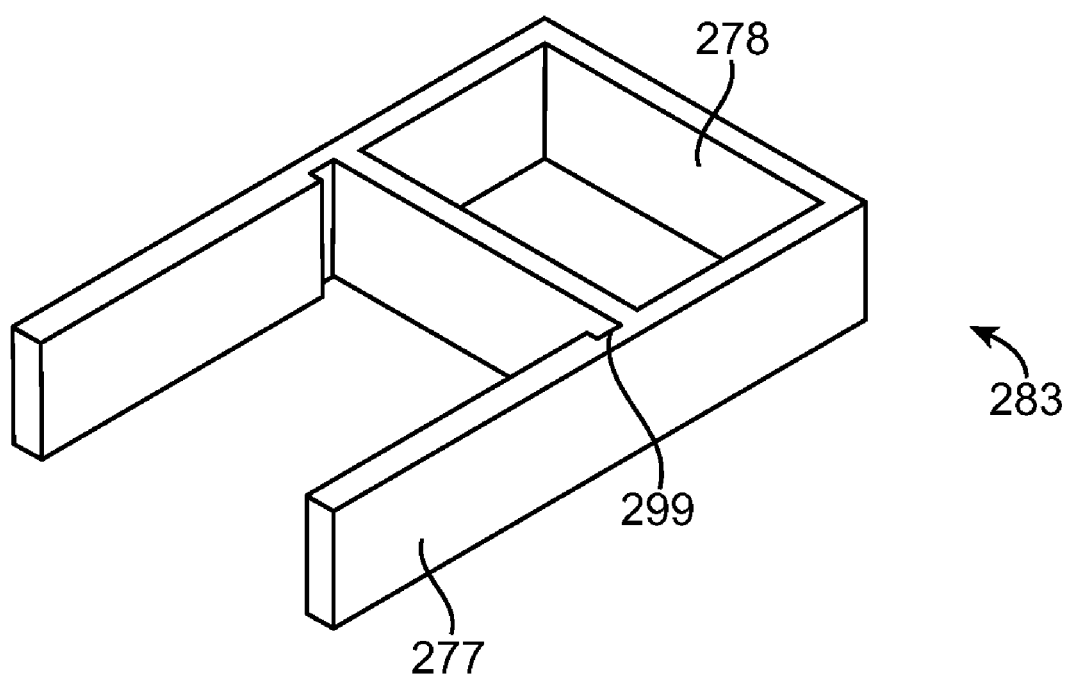

FIG. 18 shows a top angular view of frame 283.

Figure 19:
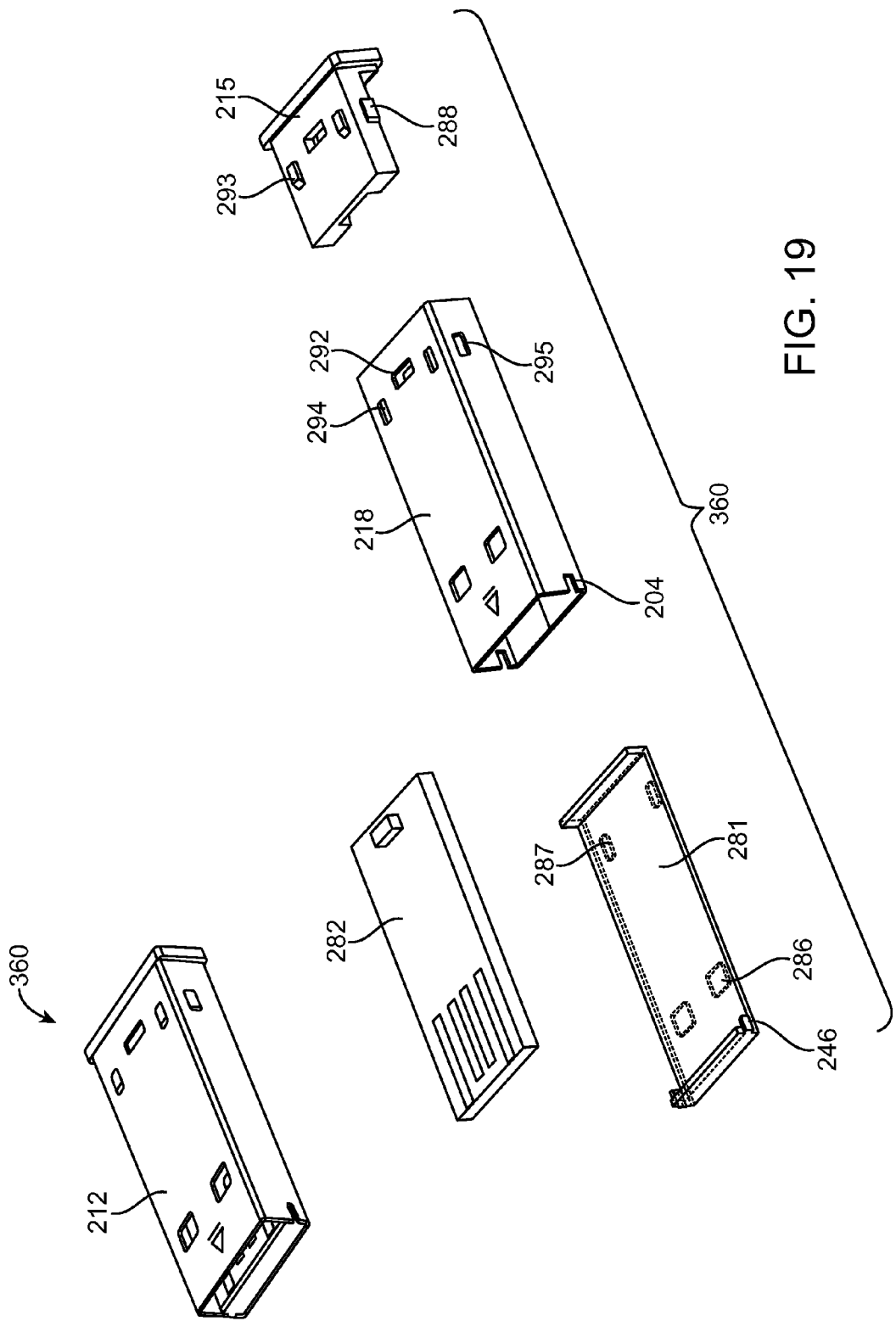

FIG. 19 shows a step used to manufacture the USB flash drive 1, in accordance with a method of the present invention. In FIG. 19 at step 315, the COB 282 is positioned into COB support 281 by pressing COB 282 into COB support 281.

FIG. 20 shows a step used to manufacture the USB flash drive 1, in accordance with a method of the present invention. In FIG. 20 at step 320, the metal case and end cap subassembly 360 is placed into lower molding 221 and then covered by upper molding 220.

DETAILED DESCRIPTION OF THE PREFERRED EMBODIMENTS

Referring now to FIG. 1(a), a universal serial bus (USB) flash drive 10 is shown to include USB metal plug 12, USB device 11, snap coupling circle attachment 9, and a swivel "strap-shaped" metal cap 13, in accordance with an embodiment of the present invention. FIG. 1(a) shows an angular perspective of the top side of the USB flash drive 10 shown at an angle so as to only show two of the four sides thereof.

USB metal plug 12 extends out from USB device 11 and is generally shown to be rectangular in shape including metal plug sides 7. USB device 11 is shown to partially enclose the metal plug 12. The metal plug 12 is shown to be narrower in width than the width of the USB device 11. The USB metal plug 12 is shown to include a metal plug front face 8 that is a hollow front side of plug 12. The metal plug sides 7 are each located on the lateral sides of plug 12 and are also partially encapsulated by the USB device 11.

The metal plug 12 generally serves to interface the USB flash drive 10 with a host device to store information received from the host device. In one embodiment of the present invention, the USB metal plug 12 establishes contact with a host in compliance with the Universal Serial Bus (USB) standard, known and adopted by the industry at large. In other embodiments of the present invention, the USB metal plug 12 is a different type of connector.

The snap coupling circle attachment 9 is shown located on the top side of the USB device 11. Specifically, circle attachment 9 is located on the loser third of device 11 toward metal plug 12. A complementary snap coupling circle attachment 9 is also located on the underside of USB device 11 in the same location (not shown in FIG. 1(a)).

"Strap shaped" metal cap 13 is shown to include protrusion snap ring 26, cap arch 5, and two cap legs 6. Each cap leg 6 bends at the top to form cap arch 5. Disposed on generally the ends of cap leg 6 on swivel "strap shaped" metal plug 13 is protrusion snap ring 26. Specifically, protrusion ring 26 is located on the bottom third opposite cap arch of cap leg 6 so as to allow the bottom of cap leg 6 to lie substantially flush with the lateral side of USB device 11. One protrusion snap ring 26 is located on each cap leg 6 on each side of metal plug 13. Snap ring 26 is centered between the lateral edges of metal cap 13.

In an alternative embodiment, snap ring 26 is disposed on generally the middle of metal cap 13, leaving an excessive length of cap leg 6 overhanging from USB device 11 when attached. In this alternative embodiment, the excess length of cap leg 6 adds size to USB flash drive 10 and makes user handling of drive 10 awkward. Cap arch 5 is shown to be arch shaped in the present embodiment. In an alternative embodiment, cap arch 5 located at the end of metal cap 13 is square shaped.

The swivel "strap-shaped" metal cap 13 is attached to the USB device 11 via the snap coupling circle attachment 9. In one embodiment of the present invention, the snap coupling circle attachment 9 enables the "strap-shaped" metal cap 13 to rotate substantially 360 degrees about the z-axis on USB device 11. In other embodiments, as will be discussed shortly, the circle attachment 9 causes the metal cap 13 to rotate less than 360 degrees about the z-axis. In one alternative embodiment, the metal cap 13 rotates substantially 180 degrees about the z-axis on USB device 11. In another alternative embodiment, the metal cap 13 rotates substantially 90 degrees on the z-axis about device 11. In additional alternative embodiments, the metal cap 13 rotates substantially between 0 and 90 degrees on the z-axis about device 11. In embodiments in which the metal cap rotates substantially less than 90 degrees about device 11 user accesses to the metal plug 12 may be generally more limited when compared to embodiments in which the metal plug 13 is free to rotate about device 11 at angles greater than 90 degrees.

In the embodiment of FIG. 1(a) the snap coupling circle attachment 9 is shown to be positioned offset, from the center of USB device 11, toward the portion of the USB metal plug 12 that is extending outwardly from USB device 11. In one alternative embodiment, the snap coupling circle attachment 9 is centered upon USB device 11. In another alternative embodiment, the snap coupling circle attachment 9 is positioned offset from center upward away from metal plug 12.

In an exemplary embodiment the metal cap 13 rotates substantially 360 degrees on the z-axis about USB device 11 and opens and closes access to metal plug 12 at positions substantially 0 and 180 degrees respectively. An open position, as used herein, refers to metal cap 13 in a position leaving metal plug 12 exposed. A closed position, as used herein, refers to metal cap 13 in a position substantially fully covering metal plug 12. In the closed position, the metal plug front face 8 is substantially completely encompassed by the metal cap 13. When in the closed position metal cap 13 protects and shields metal plug front face 8 from possibly damaging contact with other objects. While in the closed position, the metal plug sides 7 are left slightly exposed. However, the width of the metal cap 13 is substantially wider than the width of metal plug 12, thereby affording protection to the metal plug sides 7. In an exemplary embodiment of the present invention, as shown in FIG. 1(a) the metal cap 13 is of a length so as to provide sufficient clearance distance between the metal plug front face 8 and metal cap 13 when in the closed position.

In an alternative embodiment the length of metal cap 13 is greater than what is approximately required for mere clearance of metal plug front face 8, thereby increasing the distance from metal cap 13 and the metal plug front face 8. An embodiment incorporating metal cap 13 of greater length provides less protection to metal plug 12 when compared to the embodiment of FIG. 1(a). While embodiments have been disclosed herein, it is appreciated that other are contemplated by those skilled in the art.

The USB flash drive 10 is a self-contained USB memory device. USB flash drive 10 typically includes memory, such as non-volatile or flash memory, in the form of EEPROM or EPROM, in one or more semiconductor, used to store information in files. Examples of such files include word processing documents or photographs.

FIG. 1(b) shows a view of the disassembled parts of USB flash drive 10. USB flash drive 10 is shown to be comprised of USB device 11 and metal cap 13. USB device 11 is shown to include upper molding 20, lower molding 21, LED plug 24, key chain slot 28, metal cap 13, and the slim USB device 14 in accordance with an embodiment of the present invention. USB device 11 is shown not to include metal cap 13.

Located on the bottom side of upper molding 20 is upper housing 23, and located on the upper side of lower molding 21 is lower housing 22. Shown disposed upon the lateral sides of upper molding 20 are upper snap coupling tabs 44. Shown disposed upon the lateral sides of lower molding 21 are lower snap coupling tabs 55.

Upper snap coupling tabs 44 are shown to be arranged in a rectangular saw-toothed pattern. The saw-toothed pattern as shown on snap coupling tabs 44 is complementary with those of lower snap coupling tabs 55. Complementary, as defined herein, indicates a repeating pattern of rectangular blocks and gaps which fit generally snugly together when pressed against its corresponding partner repeating pattern. Disposed on both upper housing 23 and lower housing 22 is stop bar 49. Stop bar 49 is shown to be a raised rectangular bar located on the underside of both upper molding 20 and lower molding 21 approximately halfway between the center of LED plug 24 and key chain slot 28. Stop bar 49 secures in place the encapsulated portion of metal case 18 within USB device 11. Upper housing 23 and lower housing 22 are generally u-shaped. The u-shape design creates a hollow cavity between upper molding 20 and lower molding 21 when the moldings are joined.

Upper molding 20 and lower molding 21 join together to form a cavity into which slim USB device 14 is positioned. In an exemplary embodiment of the present invention, LED plug 24 placed within both upper molding 20 and lower molding 21 is made of transparent plastic to allow light to shine therethrough. When USB flash drive 10 is in use, a light emitting diode (LED) transfers light through LED plug 24, indicating to the user drive 10 is in operation.

LED plug 24 is attached off centered away from key chain slot 28 on both upper housing 23 and lower housing 22. LED plug 24 is shown to include snap lock groove 27, snap lock tab 30, and snap coupling circle attachment 9. The snap lock groove 27 is shown to be a depressed circle surrounding snap coupling circle attachment 9. Disposed on snap lock groove 27 are snap lock tabs 30. Snap lock tabs 30 are shown to be two rectangle shaped protrusions extending from the flat surface of snap groove 27. Snap lock tabs 30 extend to a height approximately half that of snap coupling circle attachment 9. The snap lock tabs 30 are arranged laterally so as to bisect snap lock groove 27 into two halves.

Metal cap 13 is shown to include circle cut-out 43, snap slot 25, and protrusion snap ring 26, in accordance with an embodiment of the present invention. Circle cut-out 43 is shown to be a circle disposed on the bottom third opposite cap arch 5 of cap leg 6 so as to allow the bottom of cap leg 6 to lie substantially flush, when attached, with the lateral side of USB device 11. Shown to be disposed underneath circle cut-out 43 in FIG. 1(b) is protrusion snap ring 26. Snap ring 26 is shown to be a raised ring on the under side of cap lag 6. Snap slots 25 are shown to be two rectangular cut outs arranged within protrusion snap ring 26 so as to bisect the ring into two halves.

Metal cap 13 attaches to USB device 11 by fitting into the LED plug 24 located on both upper molding 20 and lower molding 21. Specifically, the protrusion snap ring 26 fits located on metal cap 13 is shown to fit within snap grove 27, located on LED plug 24. Protrusion snap ring 26 is of a diameter substantially small enough to fit inside snap lock groove 27, but still maintaining the ability to rotate substantially 360 degrees (about the z-axis) about USB device 11. The difference in diameters allows for a secure interlocking fit of metal cap 13 within LED plug 24. On both the upper molding 20 and lower molding 21, the protrusion snap ring 26 fits securely inside of both of the snap lock grooves 27 shown on LED plug, thereby attaching metal cap 13 to USB device 11. The snap lock tabs 30 disposed on LED plug 24 are oriented substantially perpendicular to the snap coupling tabs 44 disposed on both upper molding 20 and lower molding 21. The substantially perpendicular orientation, described above, in the embodiment of FIG. 1(b) facilitates the locking and unlocking function of metal cap 13.

Metal cap 13 is generally in a locked position, as used herein, when the snap slot 25 is aligned atop snap lock tab 30. When locked, the snap lock tab 30 is inserted into the snap slot 25 such that the protrusion snap ring 26 is positioned flush against the snap lock groove 27. While in the locked position the metal cap 13 is set in position securely. Metal cap 13 is in an unlocked position, as used herein, when the snap slot 25 is not aligned atop snap lock tab 26. While in an unlocked position, the protrusion snap ring 26 is raised up and resting upon the two snap lock tabs 30. The locking and unlocking design requires the protrusion snap ring 26 to raise up and out of the snap lock groove 27 to rest on the snap lock tabs 30 when unlocked, and descend downward until the protrusion snap ring 26 is pressed flush with snap lock groove 27, and lock tab 30 is secured inside snap slot 25 when locked.

While in the unlocked position the metal cap 13 generally easily rotates substantially 360 degrees (on the z-axis) about USB device 11. Metal cap 13 is moved into two locked positions, locked open position one and locked closed position two. The locked open position one, as defined herein, occurs when metal cap 13 is positioned substantially at 180 degrees about the USB device 11 (on the z-axis), leaving uncovered and exposed the USB metal plug 12. In the locked open position one, USB device 11 interfaces with host devices, unprotected by metal plug 13 when connected with the host. Locked closed position two, as defined herein, occurs when metal cap 13 is positioned substantially at 0 degrees about the USB device (on the z-axis), substantially fully covering metal plug 12 and protecting it from undesirable contact.

The slim USB device 14 is shown to include a printed circuit board assembly (PCBA) 16, metal case 18, printed circuit board (PCB) support 19, and end cap 15, in accordance with an embodiment of the present invention.

PCB support 19 is shown to be rectangular in shape. The width of PCB support 19 is generally smaller than the width of USB metal plug 12. Metal case 18 is shown to be rectangular in shape. PCBA is also shown to be rectangular in shape, with LED 29 located on the top end, and contact fingers 17 located at the bottom end. The width of PCBA is smaller than that of metal case 18, so as to allow it to slide inside metal box 18 during assembly. End cap 15 is t-shaped, comprising of a rectangular box lid 66 and LED bar 58. Box lid 66 is hollow inside, and is also of a width narrower than that of metal case 18, so as to allow it to slide inside metal box 18 during assembly. The LED bar 58 is approximately centered along the top face 57 of box lid 66. The LED bar 65 serves to direct the dispersed light from the LED 29 into the translucent LED plug 24 located on the upper molding 20 and lower molding 21.

In the embodiment of FIG. 1(b), the PCB support 19 fits inside the metal case 18 to hold the PCBA 16 in place. Specifically, the contact fingers 17 shown disposed on PCBA 16 rest upon PCB support 19 when PCBA is inserted inside metal case 18. End cap 15 fits inside metal case 18 at the end opposite PCB support 19 to generally secure in place the constituent parts of USB device 11.

FIG. 1(c) shows a cross section view of USB flash drive 10. Specifically shown is USB flash drive 10 in the locked and unlocked position. Metal cap 13 is generally shown to be in a locked position when the snap slot 25 is aligned atop snap lock tab 30. When locked, the snap lock tab 30 is inserted into the snap slot 25 such that the protrusion snap ring 26 is positioned flush against the snap lock groove 27. While in the locked position the metal cap 13 is set in place securely disallowing movement of the same. Metal cap 13 is in an unlocked position when the snap slot 25 is not aligned atop snap lock tab 26. While in an unlocked position, the protrusion snap ring 26 is raised up and resting upon the two snap lock tabs 30. The locking and unlocking design requires the protrusion snap ring 26 to rise up and out of the snap lock groove 27 to rest on the snap lock tabs 30 when unlocked. When locked, protrusion snap ring 26 is descended downward until the protrusion snap ring 26 is pressed flush with snap lock groove 27, and lock tab 30 is secured inside snap slot 25.

FIG. 2 shows the top and bottom side of the PCBA 16. The PCBA top side 35 and the PCBA 36 bottom side of the PCBA 16 are shown to include various components, in accordance with the various embodiments of the present invention. The PCBA top side 35 is shown to include a PCBA front portion 37, a PCBA middle portion 38 and a PCBA end portion 39, which are all shared with the PCBA bottom side 36. On the PCBA front portion 37, there is disposed contact fingers 27, which are made of a conductive material for transferring electrical signals from the USB flash drive 10 to a host, in compliance with the USB standard.

The PCBA middle portion 38 is shown to have positioned thereon a memory integrated circuit (IC) 42 for storing files or information in digital form and generally made of non-volatile or flash memory. The PCBA end portion 39 is shown to have disposed on an end farthest from the memory integrated circuit (IC) 42, the LED 29. It should be noted that the LED 29 is optional but when present and used, signifies whether or not the USB flash drive 10 is connected to a host or operational by being lit or not.

The PCBA bottom side 36 is shown to include a controller integrated circuit (IC) 40 disposed substantially at its front portion and a memory integrated circuit (IC) 42 disposed at its middle portion 38. Optionally, the LED 29 is disposed at an end of the PCBA bottom side 36 that is farthest from the front portion 37 thereof. The LED 29, memory IC 42 and controller IC 40 are connected to a printed circuit board (PCB) substrate 41 which forms the surface (or side) of the PCBA 16 onto which the LED 29, memory IC 42 and controller IC 40 are electrically connected. The PCBA 35 or 36 are essential to the USB flash drive 10 in that they store information that can be stored in or retrieved by a host.

The contact fingers 27 and the front portion 37 comprise at least a part of a USB standard connector.

Figure 3:
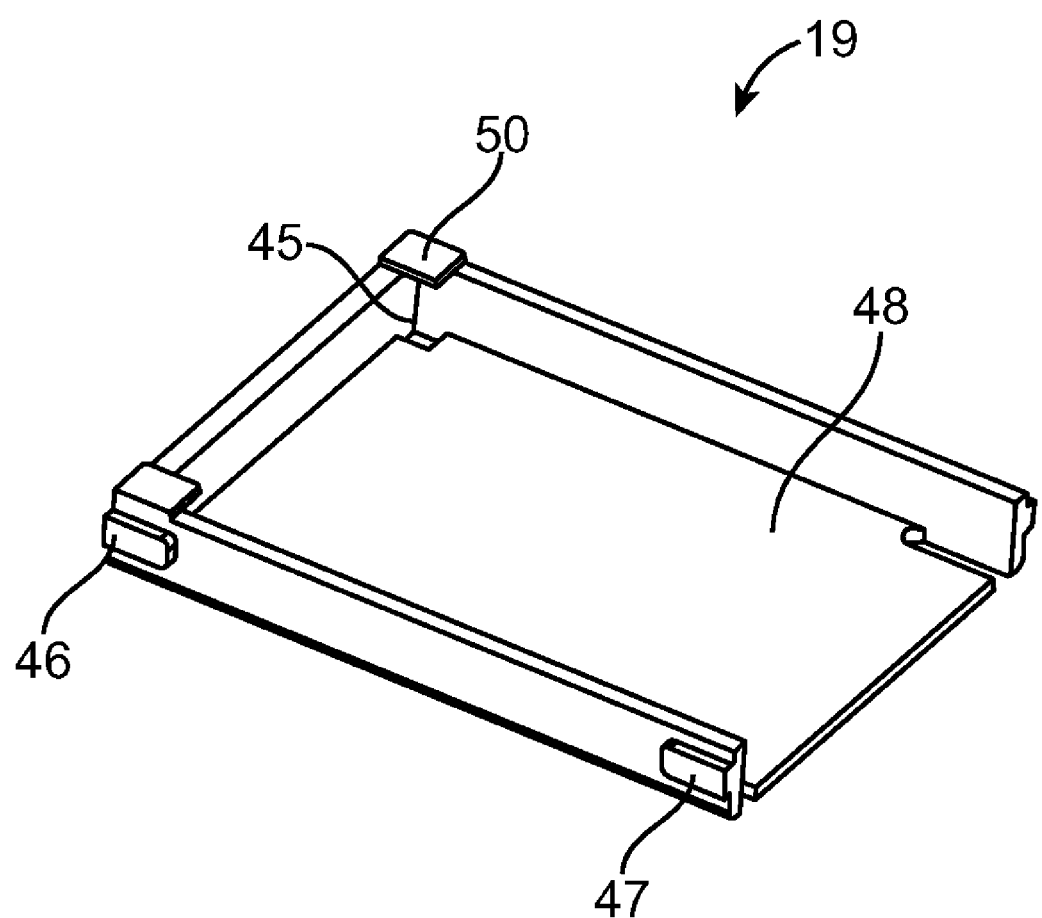
FIG. 3 shows a top angular perspective of the PCB support 19.

FIG. 3 shows a top angular perspective of the PCB support 19, in accordance with an embodiment of the present invention. The PCB support 19 is shown to include PCB support corners 45 disposed at one corner of each of the corners of the PCB support 19, a PCB tab 47 and a PCB tab 46 disposed on a lateral side of the PCB support 19, a cut-out 48 shown forming the bottom of the PCB support 19 onto which the front portions of either of the PCBA 35 or 36 is positioned onto, and protrusion tabs 50 shown positioned atop support corners 45. The PCB tab 47 and PCB tab 46 snap into the metal case back slot 3 and metal case front slot 4 of the metal case 18, respectively, when the PCB support 19 is placed into the front portion of the metal case 18 thereby securing the PCB support 19 into the metal case 18. Protrusion tabs 50 are pressed against the underside of metal case 18 when assembled and ensure that the PCBA 16 is secured in the proper location.

Figure 4B:
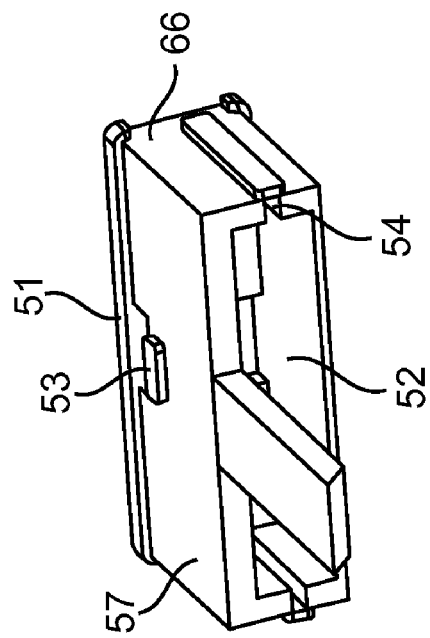
FIG. 4(b) shows a side and front angular perspective of the end cap 15.
Figure 4A:
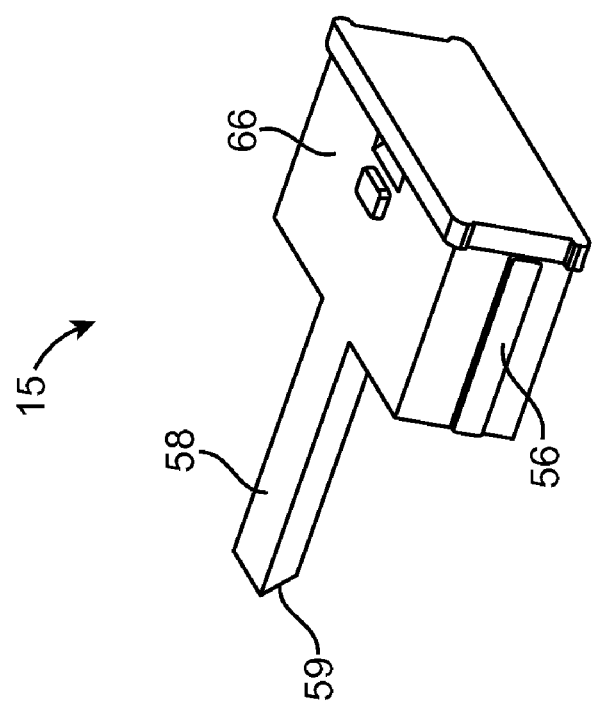
FIG. 4(a) shows a top and back angular perspective of the end cap 15, in accordance with an embodiment of the present invention.

FIG. 4(a) shows a top and back angular perspective of the end cap 15, in accordance with an embodiment of the present invention. FIG. 4(b) shows a side and front angular perspective of the end cap 15, in accordance with an embodiment of the present invention.

In FIG. 4(b), the end cap 15 is shown to be generally shaped as a three-dimensional rectangle with LED bar 58 extending from end cap top face 57, giving end cap 15 a overall general t-shape. End cap 15 is shown to include one closed end 51 and an open end 52 opposite to the closed end, LED bar 58, an end cap protrusion 53 positioned generally in the middle of its top side, and two side end cap grooves 54 disposed on either of its sides. The side end cap grooves 54 are used to slide the PCBA 16 into place in the end cap 15 and the end cap tabs 56 of the end cap 15 are used to secure the end cap 15 into the metal case 8 by snapping the end cap tabs 56 into the end slots 68.

Similarly, a metal case slot 60 of the metal case 8 snaps into the end cap protrusion 53 of end cap 15 to further secure the metal case 8 into the end cap 15.

In FIG. 4(a), shown disposed on the far end facing opposite end cap protrusion 53 on LED bar 58 is tip 59. Tip 59 is shown to be angled at its end in substantially generally a 45 degree angle. Tip 59 shown in the embodiment of FIG. 4(a) advantageously serves to direct the light dispersed from LED 29 into the translucent LED plug 24 located on upper molding 20.

Figure 5:
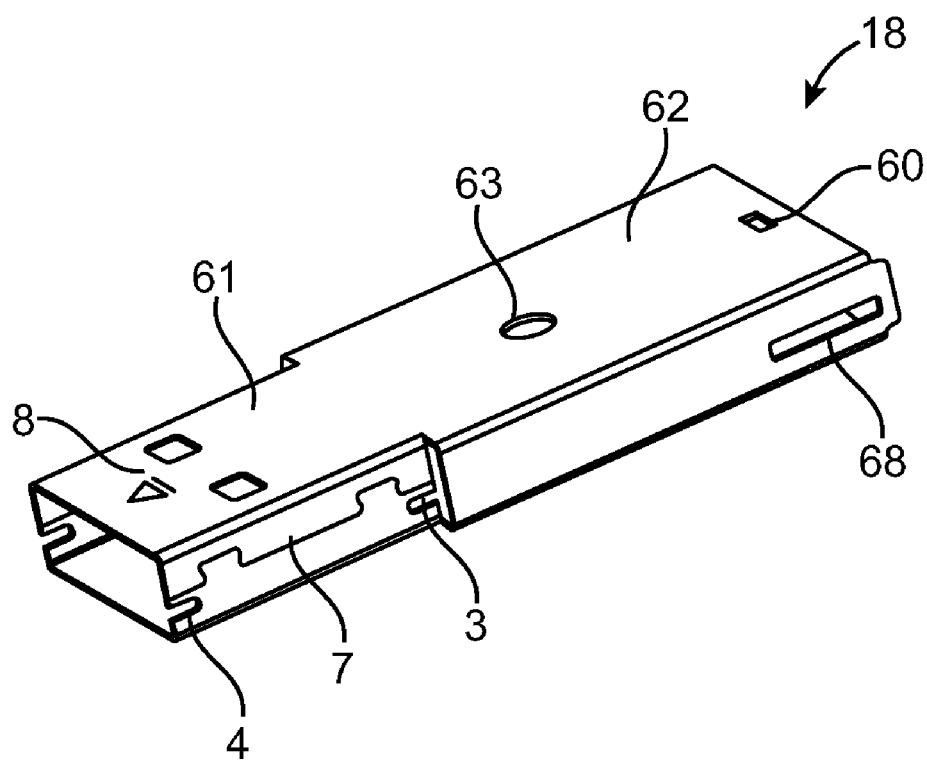
FIG. 5 shows a top and side angular view of the metal case 18 to show its relevant components in greater detail.

FIG. 5 shows a top and side angular view of the metal case 18 to show its relevant components in greater detail. Further details regarding the formation of metal case 18 is described in U.S. application Ser. No. 11/927,387, entitled "Single Chip Universal Serial Bus (USB) Package with Metal Housings", filed on Oct. 29, 2007. Metal case 18 is shown to be comprised of front portion 61 and end portion 62. In FIG. 5, metal case slot 60 is shown disposed on the top side toward the end portion 62 of metal case 18 that is farthest away from metal plug front face 8. Metal case slot 60 fits into the end cap protrusion 53 of the end cap 15 to secure the metal case 18 into the end cap 15 when the end cap 15 is slid into the metal case 18. Also shown disposed on the end portion 62 of metal case 18 are end slots 68. End slots 68 are located on the sides of end portion 62 and serve to secure end cap 15 by housing end cap tabs 56 when end cap 15 is inserted into metal case 18. LED opening 63 is disposed of substantially generally centered on end portion 62, on both the top and bottom sides of metal case 18. LED opening 63 advantageously allows light from LED 29 to except through metal case 18 thereby illuminating LED plug 24 when USB flash drive 10 is in operation.

In the embodiment of FIG. 5 disposed on the front portion 61 of metal case 18 are metal case back slots 3 and metal case front slots 4. Each of the metal case back slots 3 of metal case 18, located on either side of the metal plug side 7 of the metal case 18, house the PCB tab 47 of the PCB support 19. Metal case front slot 4 of the metal case 18 house the PCB tab 46 of the PCB support 19 when the PCB support 19 is placed into the metal case 18 thereby securing the PCB support 19 into the metal case 18.

FIG. 6 shows a top angular perspective of both the top and bottom of upper molding 20. Upper molding 20 is shown to include upper housing 23, LED plug 24, snap coupling circle attachment 9, key chain slot 28, upper snap coupling tabs 44, stop bar 49, alignment pins 72, and metal plug opening 73.

In an exemplary embodiment of the present invention alignment pins 72 are shown disposed on the underside of upper housing 23. Pins 72 are shown to be located in generally the four corners of the generally rectangle shaped upper housing 23. Alignment pins 72 advantageously insert into the alignment holes 74, located on lower molding 21, when upper molding 20 and lower molding 21 are joined together. Upper snap coupling tabs 44 are disposed on the lateral sides of upper molding 20. Upper snap coupling tabs 44 are shown to be arranged in a rectangular saw-toothed pattern. The saw-toothed pattern as shown on upper snap coupling tabs 44 is complementary with those of lower snap coupling tabs 55. Complementary, as defined herein, indicates a repeating pattern of rectangular blocks and gaps which fit generally snugly together when pressed against its corresponding partner repeating pattern. When upper molding 20 and lower molding 21 are joined, upper snap coupling tabs 44 are fit in a generally interlocking manner with lower snap coupling tabs 55. Also disposed on the underside of upper housing 23 is stop bar 49. Stop bar 49 is shown to be a raised rectangular bar located on the underside of both molding 20 and molding 21, approximately halfway between the center of LED plug 24 and key chain slot 28. Stop bar 49 secures in place the encapsulated portion of metal case 18 within USB device 11. Metal plug opening 73 is shown to be generally u-shaped and is located at the opposite end of upper housing 23 away from key chain slot 28. Key chain slot 28 is shown to be generally an oval shaped cut-out located at the opposite end of upper housing 23 away from metal plug opening 73. Key chain slot advantageously allows users to attach key rings to USB flash drive 10.

FIG. 7 shows a top angular perspective of both the top and bottom of lower molding 21. Lower molding 21 is shown to include lower housing 22, LED plug 24, snap coupling circle attachment 9, key chain slot 28, lower snap coupling tabs 55, stop bar 49, alignment holes 74, and metal plug opening 73.

In an exemplary embodiment of the present invention alignment holes 74 are shown disposed on the underside of lower housing 22. Holes 74 are shown to be located in generally the four corners of the generally rectangle shaped lower housing 22. Holes 74 advantageously receive pins 72 when inserted to join upper molding 20 with lower molding 21. Lower snap coupling tabs 55 are disposed on the lateral sides of lower molding 21. Lower snap coupling tabs 55 are shown to be arranged in a rectangular saw-toothed pattern. The saw-toothed pattern as shown on lower snap coupling tabs 55 is complementary with those of upper snap coupling tabs 44. Complementary, as defined herein, indicates a repeating pattern of rectangular blocks and gaps which fit generally snugly together when pressed against its corresponding partner repeating pattern. When upper molding 20 and lower molding 21 are joined, upper snap coupling tabs 44 are fit in a generally interlocking manner with lower snap coupling tabs 55.

Disposed on LED plug 24 are LED plug ears 70, located on opposite sides of LED plug 24 and perpendicular to snap lock tabs 30. Ears 70 serve to facilitate the joining of LED plug 24 with lower housing 22 and upper housing 23. LED plug ears 70 fit securely within LED plug ear slots 71, located on both lower housing 22 and upper housing 23. Specifically, LED plug ear slots 71 are located between metal plug opening 73 and stop bar 49 on both lower housing 22 and upper housing 23. During manufacturing LED plug 24 is placed into the LED plug ear slots 71 on either upper housing 23 or lower housing 22 and then molded into place.

Figure 8:
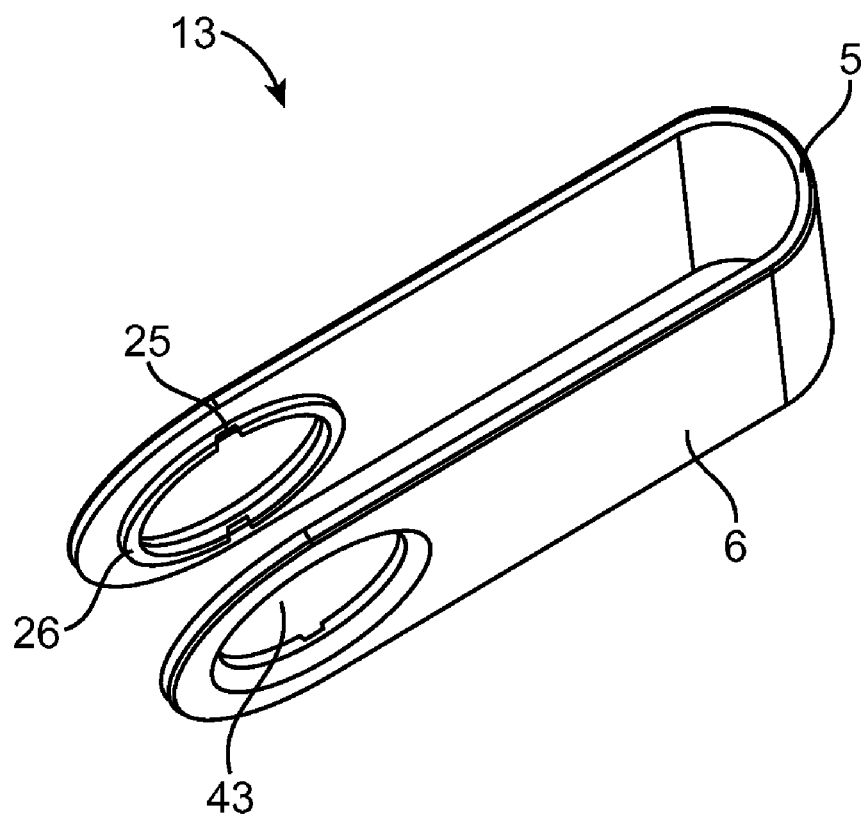
FIG. 8 shows a top angular view of metal cap 13 turned on its side.

FIG. 8 shows a top angular view of metal cap 13 turned on its side. Metal cap 13 is shown to include circle cut-out 43, snap slot 25, and protrusion snap ring 26, in accordance with an embodiment of the present invention. Circle cut-out 43 is shown to be a circle disposed on the bottom third opposite cap arch 5 of cap leg 6 so as to allow the bottom of cap leg 6 to lie substantially flush, when attached, with the lateral side of USB device 11. Shown to be disposed underneath circle cut-out 43 in FIG. 8 is protrusion snap ring 26. Snap ring 26 is shown to be a raised ring on the underside of cap lag 6. Snap slots 25 are shown to be two rectangular cut outs arranged within protrusion snap ring 26 so as to bisect the ring into two halves.

FIGS. 9-11 show steps used to manufacture the USB flash drive 10, in accordance with a method of the present invention. In FIG. 9, at step 115, the PCB support 19 is positioned into the metal case 18 by pressing the PCB support 19 into the metal case 18 until the PCB tab 47 of the PCB support 19 snap into the metal case back slot 3 of the metal case 18, and the PCB tab 46 of the PCB support 19 snap into the metal case front slot 4 of the PCB support 16. It should be noted that two metal case back slots 3s are located on either side of the USB metal plug 12 of the metal case 18 in the positions shown in FIG. 9 and two metal case front slots 4s are located on either side of the USB metal plug 12 of the metal case 18 in the positions shown in FIG. 9. Similarly, two PCB tabs 46s are located on either side of the PCB support 19 in the positions shown in FIG. 9 and two PCB tabs 47s are located on either side of the PCB support 19 in the positions shown in FIG. 9.

Next, the PCBA 16 is slid into the metal case 18 at the end of the metal case 18 that is opposite to the end holding the PCB support 19 in place. The metal case 18 is shown to have USB metal plug 12 generally encapsulating the PCB support 19. When the PCBA 19 is positioned in its entirety within the metal case 18, the front portion 37 of the PCBA 16 is located within the USB metal plug 12 of the metal case 18 and the remainder of the PCBA 16 is located in within the inside of the remainder of the metal case 18. Front portion 37 of the PCBA 16 is supported in place by PCB support 19.

Next, the end cap 15 is pressed into the metal case 18. In doing so, the end cap tabs 56 of the end cap 15 are snapped into the end slots 68 of the metal case 18 on each side of the end cap 15 and the metal case 18. Once the end cap 15 is inserted in the metal case 18, a metal case and end cap sub-assembly 124 is formed. Furthermore, the PCBA 16 within the metal case 18 is completely secured inside of the metal case 18 with the PCBA 16 front portion 37 being supported by the PCB support 19 and the PCBA end portion 39 being supported by the end cap 15.

In FIG. 10, at step 125, the metal case and end cap sub-assembly 124 is placed into lower molding 21. More specifically, the end portion 62 of metal case 18 is placed within lower molding 21 so as to fit generally securely between stop bar 49 and metal plug opening 73. Next, upper molding 20 is pressed into place upon lower molding 21. To facilitate the joining of upper molding 20 and lower molding 21, upper snap coupling tabs 44 are aligned to fit securely within lower snap coupling tabs 55 and alignment pins 72 located on upper molding 20 are fit within alignment holes 74 located on lower molding 21. Upon the joining of upper molding 20 with lower molding 21 to generally encapsulate the metal case and end cap-sub assembly 124, USB device 11 sub-assembly 134 is formed.

In FIG. 11, at step 140, metal cap 13 is attached to USB device 11 sub-assembly 134. More specifically, the protrusion ring 26 of metal cap 13 is pressed against snap lock groove 27 of USB device 11 sub-assembly 134. Snap lock grooves 27 are disposed on LED plug 24. LED plug 24 is located on both the top face (show) and the bottom face (not shown) of USB device 11 sub-assembly 134. When pressed against snap lock groove 27, the protrusion snap ring descends into snap lock groove 27 thereby attaching metal cap 13 to USB device 11 sub-assembly 134, and completing the assembly of USB flash drive 10.

FIG. 12 shows a top view of USB flash drive 10 with metal cap 13 in locked closed position two. While in the locked closed position two, metal cap 13 is positioned at substantially zero degrees, and metal plug 12 is generally substantially encapsulated inside metal cap 13. In locked closed position two, snap slot 25 of metal cap 13 is secured atop snap lock tab 30.

FIG. 13 shows a top view of USB flash drive 10 with metal cap 13 in locked open position one. While in the locked open position one metal cap 13 is positioned at substantially 180 degrees, and metal plug 12 is completely uncovered and clear of metal cap 13. In locked open position one, snap slot 25 of metal cap 13 are again secured atop snap lock tab 30.

Figure 14:
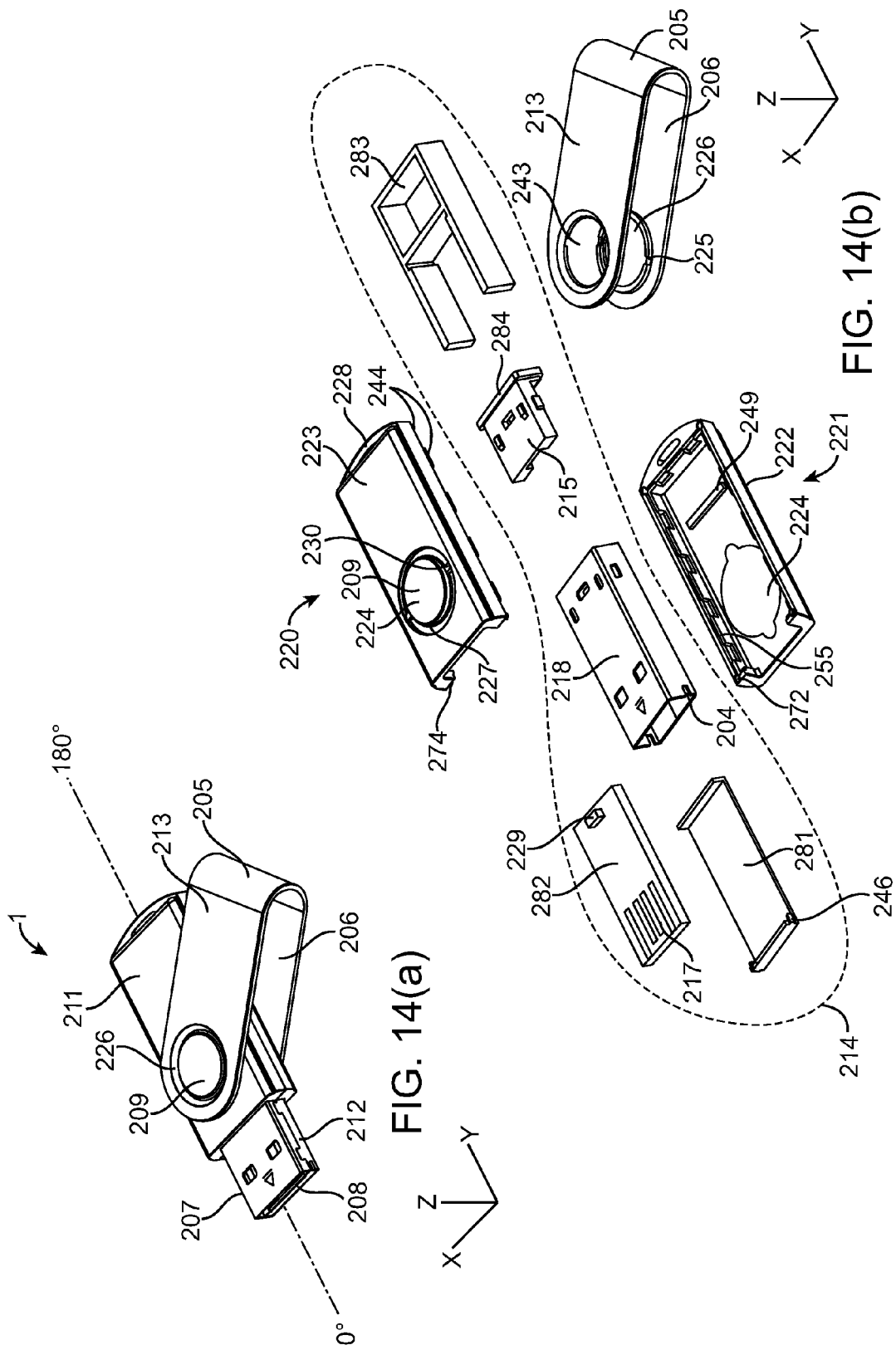

FIG. 14(*a*) shows parts of a USB flash drive 1, in accordance with another embodiment of the present invention. In FIG. 14(*a*), a USB flash drive 1 is shown to include USB metal plug 212, USB device 211, snap coupling circle attachment 209, and a metal cap 213. FIG. 14(*a*) shows an angular perspective of the top side of the USB flash drive 1 shown at an angle so as to only show two of the four sides thereof.

FIG. 14(*b*) shows a view of the disassembled parts of USB flash drive 1. USB flash drive 1 is shown to be comprised of USB device 211 and metal cap 213. USB device 211 is shown to include upper molding 220, lower molding 221, LED plug 224, key chain slot 228, metal cap 213, and the slim USB device 214. USB device 211 is shown not to include metal cap 213.

Upper molding 220 is shown to include LED plug 224, snap coupling circle attachment 209, snap lock tab 230, key chain slot 228, lower snap coupling tabs 244, upper housing 223, and alignment pins 272.

Lower molding 221 is shown to include LED plug 224, stop bar 249, lower housing 222, lower snap coupling tabs 255, and alignment holes 272.

Slim USB device 214 is shown to include chip on board (COB) 282, COB support 281, metal case 218, end cap 215, and frame 283. COB 282 is generally rectangular shaped. Disposed upon generally the bottom half of COB 282 are contact fingers 217. Located on generally the top half and centered between the lateral sides of COB 282 is LED 229. COB support 281 is shown to be generally rectangular shaped. Support 281 is substantially longer than COB 282 so as to allow COB 282 to be positioned atop COB support 281. Disposed on the lateral sides of support 281 are COB tabs 246. COB tabs 246 are shown to be inserted into metal case front slots 204 when support 281 is inserted into metal case 218. Metal case 218 is shown to be generally three dimensionally rectangular shaped with a hollow center. Disposed on the lateral sides of metal case 218 are metal case front slots 204. End cap 215 is shown to be generally rectangular shaped with an end cap top 284, also generally rectangular shaped, disposed upon the top face of cap 215 horizontally. Also comprising slim USB device 214 is frame 283. Frame 283 is generally shaped like a digital rendering of the number 8 with the bottom horizontal line removed. The lower opening of frame 283 is shaped so as to secure and hold in place metal case 218 with end cap 215 attached.

Metal cap 213 is shown to include circle cut-out 243, protrusion snap ring 226, snap slot 225, cap leg 206, and cap arch 205.

FIG. 15 shows the top and underside views of COB support 281. The top view of COB support 281 shows lower lip 286, upper lip 285, COB cut-out 280, and COB tabs 246. Lower lip 286 is show to be disposed on the lower vertical edge of support 281. Upper lip 285 is shown to be disposed on the upper vertical edge of support 281. COB cut-out 280 comprises of the center area of COB support 281 located between lip 286 and lip 285. Located on the lower corners where the lateral edge of COB support 281 and the lower lip 286 join are COB tabs 246. The underside view of FIG. 15 shows the back tabs 286 and the back tabs 287. The tabs 286 are disposed on approximately the lower third on the underside of COB support 281. Tabs 287 are disposed on approximately the upper third of the underside of COB support 281. Both tabs 286 and tabs 287 serve to secure COB support 281 to metal case 218 when joined together.

FIG. 16 shows the top and underside views of end cap 215. Disposed on the top face of end cap 215 is LED opening 290. LED opening serves to allow light from the LED 229 to pass through the end cap 215. Also disposed on the top face of end cap 215 are end tabs 293. End tabs 293 are located on either side of LED opening 290. Disposed on the sides of end cap 215 are end tabs 288. These are approximately centered on the sides of end cap 215 and serve to attach end cap 215 to metal case 218. End tabs 293 also are shown to attach end cap 215 to metal case 218. Also disposed on end cap 215 are protrusion edge snap coupling tabs 289. Tabs 289 are located on the edges of end cap top 284 and serve to secure end cap 215 within frame 283. Disposed on the underside of end cap 215 are COB end stops 291. COB end stops 291 are shown to be raised generally rectangular shaped sides of end cap 215. COB end stops 291 advantageously properly align COB 282 within metal case 218.

FIG. 17 shows the top and underside views of metal case 218. Disposed on the top face of metal case 218 are end slots 294 and LED opening 292. LED opening 292 is approximately centered between the lateral edges of metal case 218. Disposed between LED opening 292 and the lateral edge of metal case 218 are end slots 294. Located on the side faces of metal case 218 are end slots 295 and metal case front slots 204. End slots 295 are disposed on the sides of metal case 218 away from metal plug 212, and slots 204 are shown to be disposed on the opposite end of metal case 218, away from end slots 295 on the sides of metal case 218. End slots 294 and end slots 295 allow end cap 215 to attach to metal case 218. Slots 204 facilitate the attachment of COB support 281 by housing COB tabs 246 when COB support 281 is attached to metal case 218.

Shown disposed on the underside of metal case 218 are back slots 297 and back slots 296. Back slots 297 are located on the lower third of metal case 218, opposite the LED opening 292. Disposed on the upper third of metal case 218 are back slots 296, opposite metal plug 212. Back slots 297 snap together with back tab 286 on COB support 281 and back slots 296 snap together with back tabs 287 on COP support 281 to attach COB support 281 to metal case 218.

FIG. 18 shows a top angular view of frame 283. Frame 283 is generally shaped like a digital rendering of the number 8 where the bottom horizontal line has been removed. The lower opening of frame 283 is shaped so as to secure and hold in place metal case 218 with end cap 215 attached. As shown in FIG. 18 the generally rectangular shaped frame box 278 has two frame legs 277 extending from the lower corners of frame box 278. Located at the intersection of the frame legs 277 and frame box 278 are snap coupling slots 299. Positioned on each side of frame 283 the snap coupling slots 299 are shown to be generally rectangular indentions in each frame leg 277. When assembled, snap coupling slots 299 advantageously house the protrusion edges 289 when metal case 218 with end cap 215 attached is positioned within frame 283.

FIGS. 19-20 show steps used to manufacture the USB flash drive 1, in accordance with another embodiment of the present invention. In FIG. 19, at step 315, the COB 282 is positioned into COB support 281 by pressing COB 282 into COB support 281.

Next, the COB support 281 with COB 282 attached is slid into the metal case 218. The metal case 218 is shown to have USB metal plug 212 disposed to encapsulate the COB support 281. When the COB support 281 with COB 282 attached is inserted into metal case 218 front tabs 246 disposed on COB support 281 snap into front slots 204 on metal case 218. Additionally, back tabs 286 snap into back slots 297 (not shown in FIG. 19) to further secure COB support 281 with COB 282 attached within metal case 218.

Next, end cap 215 is inserted into metal case 218 at the opening opposite metal plug 212. End cap 215 is snapped into position when end tabs 288 disposed on end cap 215 are inserted into end slots 295 disposed on metal case 218, and end tabs 293 disposed on end cap 215 are inserted into end slots 294 disposed on metal case 218. Metal case and end cap sub-assembly 360 is thus formed.

FIG. 20, at step 320, the metal case and end cap sub-assembly 360 is placed into lower molding 221 and then covered by upper molding 220. More specifically, frame 283 is inserted into lower molding 221 so as to fit between stop bar 249 and metal plug opening 273. Next, sub-assembly 360 is inserted into frame 283 within lower molding 221. Tabs 289 disposed on end cap 213 align to fit inside slots 299 thereby securing sub-assembly 360 inside frame 283. Next, upper molding 220 is inserted atop lower molding 221 holding the frame 293 and sub-assembly 360. Alignment pins 274 and tabs 244 join alignment holes 272 and tabs 255 respectively to secure upper molding 220 in place atop lower molding 221. USB device 211 is thus formed.

What is claimed is:

1. A Universal Serial Bus (USB) flash drive comprising:
    a slim USB device having an end used to couple the USB flash drive to a host and an opposite end;
    a USB device "strap shaped" swivel metal cap having a circle cut out disposed on both cap legs;
    a USB device snap coupling circle attachment where said swivel cap attaches to said USB device thereby allowing the swivel cap to rotate substantially into a first and a second locking position and rotate substantially 360 degrees about the z-axis of the USB device;
    the snap coupling circle attachment on the top side of the swivel cap is used to lock and unlock the swivel cap in place, wherein the swivel cap locks substantially in a first locking position and a second locking position, wherein the metal cap is in a locked position when the snap slot is aligned atop snap lock tab, wherein the metal cap is in a locked position when the snap lock tab is insertably positioned into the snap slot such that the protrusion snap ring is positioned flush against the snap lock groove, wherein the metal cap is in a unlocked position when the snap slot is not aligned atop snap lock tab and the protrusion snap ring is raised up and resting upon the two snap lock tabs, wherein the locking and unlocking design requires the protrusion snap ring to raise up and out of the snap lock groove to rest on the snap lock tabs when unlocked, and descend downward until the protrusion snap ring is pressed flush with snap lock groove, and lock tab is secured inside snap slot, when locked.

2. A USB flash drive, as recited in claim 1, wherein the swivel cap is in locked closed position two at 0 degrees and locked open position one 180 degrees about the z-axis of the USB device, thereby leaving the USB metal plug substantially encapsulated by the swivel cap at substantially 0 degrees and exposed when the swivel cap is at substantially 180 degrees.

3. A USB flash drive, as recited in claim 2, wherein a top upper and lower molding are joined to form a hollow housing which substantially encapsulates the metal case, while leaving the USB metal plug exposed.

4. A USB flash drive, as recited in claim 3, wherein the swivel cap rotates about the z-axis of the USB device 270 degrees.

5. A USB flash drive, as recited in claim 3, wherein the swivel cap rotates about the z-axis of the USB device 180 degrees.

6. A USB flash drive, as recited in claim 3, wherein said USB device includes a printed circuit board assembly (PCBA).

7. A USB flash drive, as recited in claim 6, wherein a printed circuit board (PCB) support is insertably positioned into a metal case to secure a PCBA in place, and an end cap is positioned into the metal case.

8. A USB flash drive, as recited in claim 7, wherein the PCBA includes a top surface and a bottom surface and the top surface includes a light emitting diode (LED) that lights when the USB flash drive in operation.

9. A USB flash drive, as recited in claim 3, wherein said USB device includes a chip on board (COB) circuit board.

10. A USB flash drive, as recited in claim 9, wherein a COB support is inserted into a metal case to secure said COB in place, and an end cap is attached to the metal case.

11. A USB flash drive, as recited in claim 10, wherein the PCBA includes a top surface and a bottom surface and the top surface includes a light emitting diode (LED) that lights when the USB flash drive in operation.

12. A method of manufacturing a universal serial bus (USB) flash drive comprising:
    securing a printed circuit board (PCB) support into a metal case;
    aligning a printed circuit board assembly (PCBA) into a metal case to form a PCBA sub-assembly;
    pressing an end cap into the formed PCBA sub-assembly to form a PCBA end cap sub-assembly;
    forming a USB device by positioning the PCBA end cap sub-assembly in between an upper and a lower molding;
    aligning the PCBA end cap sub-assembly inside the upper and lower moldings to form a USB device sub-assembly; and
    attaching the metal cap to the USB device sub-assembly thereby enabling the swivel cap to lock in a first locking position and a second locking position, wherein the metal cap is in a locked position when the snap slot is aligned atop snap lock tab, wherein the metal cap is in a locked position when the snap lock tab is inserted into the snap slot such that the protrusion snap ring is positioned flush against the snap lock groove, wherein the metal cap is in a unlocked position when the snap slot is not aligned atop snap lock tab and the protrusion snap ring is raised up and resting upon the two snap lock tabs, wherein the locking and unlocking design requires the protrusion snap ring to raise up and out of the snap lock groove to rest on the snap lock tabs when unlocked, and descend downward until the protrusion snap ring is pressed flush with snap lock groove, and lock tab is secured inside snap slot, when locked.

13. A method of manufacturing a universal serial bus (USB) flash drive comprising:

securing a chip on board (COB) support into a metal case;

aligning a (COB) into a metal case to form a COB sub-assembly;

pressing an end cap into the formed COB sub-assembly to form a COB end cap sub-assembly;

forming a USB device by positioning the COB end cap sub-assembly inside a frame in between an upper and a lower molding;

aligning the COB end cap sub-assembly inside the frame and between the upper and lower moldings to form a USB device sub-assembly; and attaching the metal cap to the USB device sub-assembly thereby enabling the swivel cap to lock in a first locking position and a second locking position, wherein the metal cap is in a locked position when the snap slot is aligned atop snap lock tab, wherein the metal cap is in a locked position when the snap lock tab is inserted into the snap slot such that the protrusion snap ring is positioned flush against the snap lock groove, wherein the metal cap is in a unlocked position when the snap slot is not aligned atop snap lock tab and the protrusion snap ring is raised up and resting upon the two snap lock tabs, wherein the locking and unlocking design requires the protrusion snap ring to raise up and out of the snap lock groove to rest on the snap lock tabs when unlocked, and descend downward until the protrusion snap ring is pressed flush with snap lock groove, and lock tab is secured inside snap slot, when locked.

\* \* \* \* \*